(12) United States Patent
Lee

(10) Patent No.: US 12,219,854 B2
(45) Date of Patent: Feb. 4, 2025

(54) DISPLAY DEVICE

(71) Applicant: Samsung Display Co., LTD., Yongin-si (KR)

(72) Inventor: Hyeon Bum Lee, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/865,071

(22) Filed: Jul. 14, 2022

(65) Prior Publication Data

US 2023/0172026 A1 Jun. 1, 2023

(30) Foreign Application Priority Data

Nov. 30, 2021 (KR) .......................... 10-2021-0168373

(51) Int. Cl.
*H10K 59/40* (2023.01)
*H05K 1/18* (2006.01)
*H10K 50/84* (2023.01)
*H10K 50/856* (2023.01)
*H10K 50/86* (2023.01)

(52) U.S. Cl.
CPC ............. *H10K 59/40* (2023.02); *H05K 1/189* (2013.01); *H10K 50/84* (2023.02); *H10K 50/856* (2023.02); *H10K 50/865* (2023.02); *H05K 2201/10128* (2013.01)

(58) Field of Classification Search
CPC ......... H05K 1/189; H05K 2201/10128; H10K 50/865; H10K 50/856; H10K 50/84; H10K 59/878; H10K 59/40; H10K 59/8791; H10K 59/8731; H10K 59/8792

USPC ................................................... 345/173, 76
See application file for complete search history.

(56) References Cited

U.S. PATENT DOCUMENTS

| 2012/0326194 A1* | 12/2012 | Son ...................... H10K 59/873 |
| | | 257/40 |
| 2017/0237038 A1* | 8/2017 | Kim ....................... H10K 77/10 |
| | | 257/40 |
| 2017/0317315 A1* | 11/2017 | Yang ...................... G06F 3/0412 |
| 2018/0197921 A1* | 7/2018 | Kim ...................... H10K 50/865 |
| 2020/0091247 A1* | 3/2020 | Lee ......................... H10K 59/38 |
| 2020/0321406 A1* | 10/2020 | Lee ......................... H10K 59/40 |
| 2020/0357871 A1* | 11/2020 | Chung ................. H10K 50/865 |

FOREIGN PATENT DOCUMENTS

| CN | 113066842 | 7/2021 |
| KR | 10-2017-0063297 | 6/2017 |
| KR | 10-2021-0070667 | 6/2021 |
| KR | 10-2021-0109716 | 9/2021 |

* cited by examiner

*Primary Examiner* — Jimmy H Nguyen
(74) *Attorney, Agent, or Firm* — KILE PARK REED & HOUTTEMAN PLLC

(57) ABSTRACT

A display device according to an embodiment includes a light emitting element disposed on a substrate, and including a first electrode, an emission layer, and a second electrode; a low-reflective layer disposed on the light emitting element, and including an inorganic material; an encapsulation layer positioned on the low-reflective layer; a reflection adjustment layer positioned on the encapsulation layer; a capping layer positioned on the reflection adjustment layer; and an overcoat layer positioned on the capping layer.

18 Claims, 18 Drawing Sheets

DISPLAY DEVICE

CROSS-REFERENCE TO RELATED APPLICATION(S)

This application claims priority to and benefits of Korean Patent Application No. 10-2021-0168373 under 35 U.S.C. § 119, filed in the Korean Intellectual Property Office (KIPO) on Nov. 30, 2021, the entire contents of which are incorporated herein by reference.

BACKGROUND

1. Technical Field

Embodiments of the disclosure relate to a display device with improved display quality.

2. Description of the Related Art

A display device is a device that displays a screen, and includes a liquid crystal display (LCD), an organic light emitting diode (OLED) display, and the like. Such a display device is used in various electronic devices such as portable phones, navigation devices, digital cameras, electronic books, portable game devices, or various terminals.

The above information disclosed in this Background section is only for enhancement of understanding of the background of the disclosure, and therefore it may contain information that does not form the prior art that is already known in this country to a person of ordinary skill in the art.

SUMMARY

Embodiments provide a display device with improved display quality by including an inorganic layer positioned between a reflection adjustment layer and an overcoat layer.

However, embodiments of the disclosure are not limited to those set forth herein. The above and other embodiments will become more apparent to one of ordinary skill in the art to which the disclosure pertains by referencing the detailed description of the disclosure given below.

A display device according to an embodiment includes a light emitting element disposed on a substrate, and including a first electrode, an emission layer, and a second electrode; a low-reflective layer disposed on the light emitting element, and including an inorganic material; an encapsulation layer positioned on the low-reflective layer; a reflection adjustment layer positioned on the encapsulation layer; a capping layer positioned on the reflection adjustment layer; and an overcoat layer positioned on the capping layer.

The reflection adjustment layer may selectively absorb a first wavelength region and a second wavelength region among a visible ray band, and the first wavelength region may be in a range of about 480 nm to about 505 nm and the second wavelength region may be in a range of about 585 nm to about 605 nm.

The capping layer may include an inorganic material.

The display device may further include a display area, a peripheral area that surrounds the display area, a first component area, and a second component area. The first component area and the second component area may be disposed in the display area.

The reflection adjustment layer may include an opening that overlaps the first component area and the second component area in a plan view, and the capping layer may form a step in the opening.

The capping layer may overlap in a plan view the display area that includes the first component area and the second component area, and a thickness of the capping layer may be uniform throughout the display area.

The overcoat layer may fill the step.

The display device may further include a first conductive layer positioned on the encapsulation layer; a first touch insulation layer positioned on the first conductive layer; a second conductive layer positioned on the first touch insulation layer; and a light blocking member positioned on the second conductive layer.

The display device may further include a second touch insulation layer disposed between the light blocking member and the second conductive layer.

The second conductive layer may contact the light blocking member.

The display device may further include a partition wall overlapping the first electrode in a plan view and including a first opening that exposes at least a part of the first electrode.

The capping layer and the overcoat layer may include a second opening overlapping the first opening in a plan view.

The capping layer and the overcoat layer may overlap the first opening in a plan view.

A display device according to an embodiment includes a display area; a peripheral area; a light emitting element disposed on a substrate in the display area, and including a first electrode, an emission layer, and a second electrode; a low-reflective layer disposed on the light emitting element and including an inorganic material; an encapsulation layer positioned on the low-reflective layer; a reflection adjustment layer positioned on the encapsulation layer; a capping layer positioned on the reflection adjustment layer; and an overcoat layer positioned on the capping layer. The capping layer and the overcoat layer overlap a peripheral area in a plan view.

The display device may further include a first conductive layer positioned on the encapsulation layer; a first touch insulation layer positioned on the first conductive layer; a second conductive layer positioned on the first touch insulation layer; and a light blocking member positioned on the second conductive layer.

The peripheral area may include a driver pad portion and an FPCB pad portion.

The display device may further include a second touch insulation layer disposed between the second conductive layer and the light blocking member, and the second touch insulation layer, the capping layer, and the overcoat layer may be disposed between the driver pad portion and the FPCB pad portion.

The display device may further include a second touch insulation layer disposed between the second conductive layer and the light blocking member, and the second touch insulation layer, the reflection adjustment layer, the capping layer, and the overcoat layer may be disposed between the driver pad portion and the FPCB pad portion.

The capping layer and the overcoat layer may be disposed between the driver pad portion and the FPCB pad portion.

The reflection adjustment layer, the capping layer, and the overcoat layer may be disposed between the driver pad portion and the FPCB pad portion.

According to the embodiments, the inorganic layer positioned between the reflection adjustment layer and the overcoat layer is included and thus the characteristic of the reflection adjustment layer may be maintained, and display quality of the display device may be improved.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
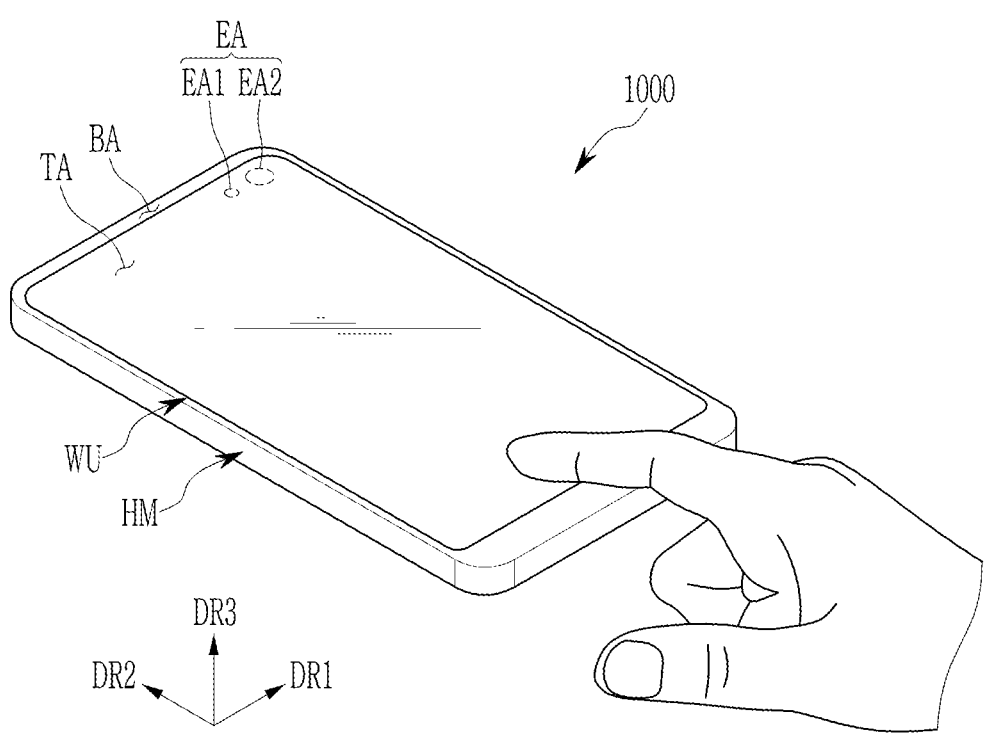
FIG. 1 is a schematic perspective view of a display device in a use state according to an embodiment.

In the following description, for the purposes of explanation, numerous specific details are set forth in order to provide a thorough understanding of various embodiments of implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

When an embodiment may be implemented differently, a specific process order may be performed differently from the described order. For example, two consecutively described processes may be performed substantially at the same time or performed in an order opposite to the described order. Also, like reference numerals denote like elements throughout the specification.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrative elements, and/or any other characteristics, attribute, property, etc., of the elements, unless specified. Further, in the accompanying drawings, the size and relative sizes of elements may be exaggerated for clarity and/or descriptive purposes.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The terminology used herein is for the purpose of describing particular embodiments and is not intended to be limiting. As used herein, the singular forms, "a," "an," and "the" are intended to include the plural forms (or meanings) as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Further, throughout the specification, the phrase "on a plane" means viewing a target portion from the top, and the phrase "on a cross-section" means viewing a cross-section formed by vertically cutting a target portion from the side.

Figure 2:
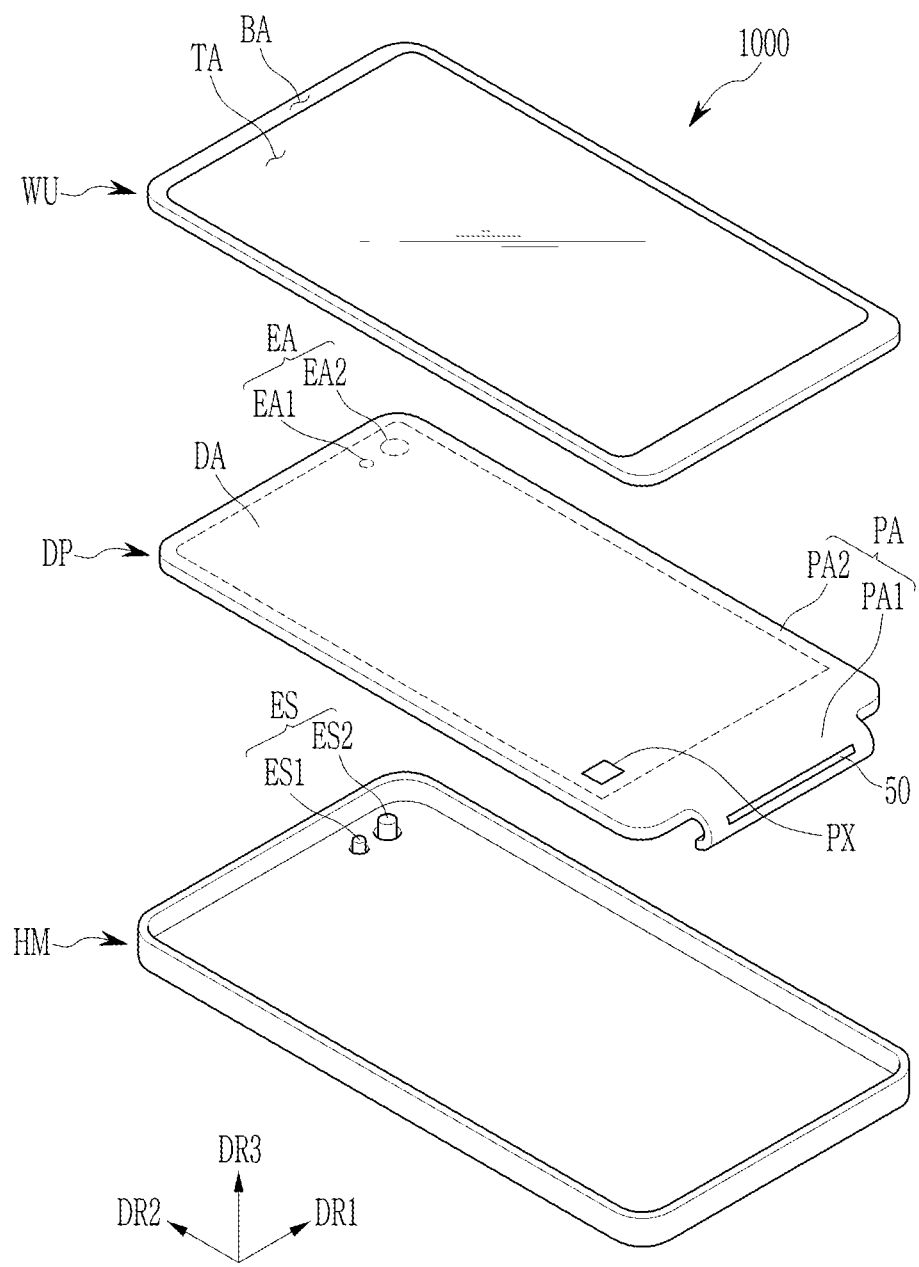
FIG. 2 is a schematic exploded perspective view of the display device according to the embodiment.
Figure 3:
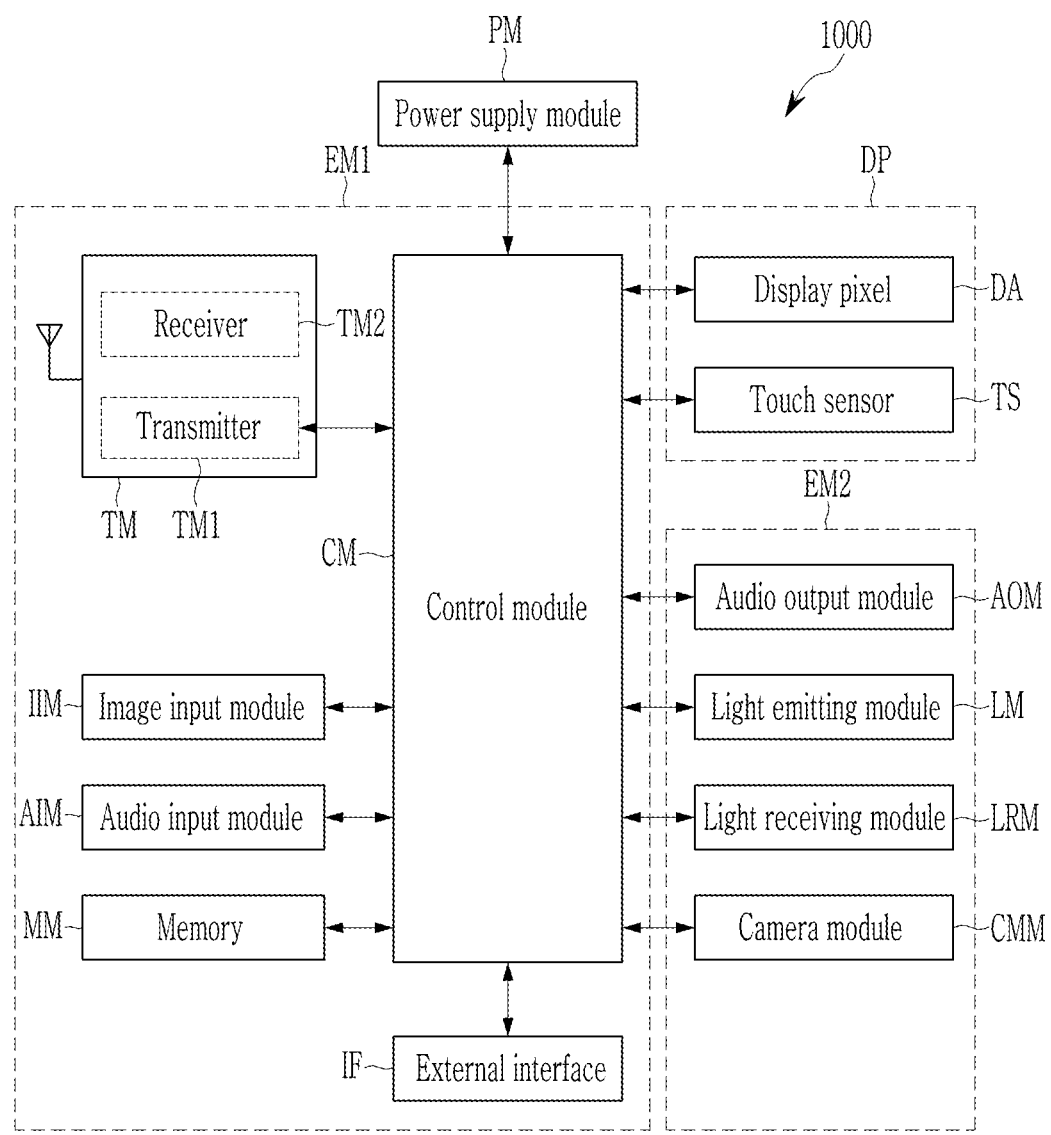
FIG. 3 is a schematic block diagram of the display device according to the embodiment.

A structure of a display device will be schematically illustrated with reference to FIGS. 1 to 3. FIG. 1 is a schematic perspective view of a display device in a use state according to an embodiment. FIG. 2 is a schematic exploded perspective view of the display device according to the embodiment. FIG. 3 is a schematic block diagram of the display device according to the embodiment.

Referring to FIG. 1, a display device 1000 according to an embodiment may be a device that displays a motion picture or a still image, and may be used as a display screen of various portable electronic devices such as a mobile phone, a smart phone, a tablet personal computer, a mobile communication terminal, an electronic notebook, an electronic book, a portable multimedia player (PMP), a navigation device, an ultra-mobile PC (UMPC), and the like. The display device 1000 may be used as a display screen of various products such as a television, a laptop, a monitor, a billboard, an Internet of things (JOT), and the like. The display device 1000 according to the embodiment may be used in a wearable device such as a smart watch, a watch phone, a glasses display, and a wearable device such as a head mounted display (HMD). The display device 1000 according to the embodiment may be used as an instrument panel of a car, a center fascia or a center information display (CID) disposed on a dashboard of a vehicle, a room mirror display that replaces a side mirror of a car, or a display disposed on a back of a front seat for entertainment for a passenger seat in a rear seat of a vehicle. FIG. 1 illustrates that the display device 1000 is used as a smart phone for better comprehension and ease of description.

The display device 1000 may display an image toward a third direction DR3 on a display plane that is parallel with a first direction DR1 and a second direction DR2. The display plane where an image is displayed may correspond to a front surface of the display device 1000, and may correspond to a front surface of a cover window WU. The image may include a motion picture as well as a still image.

In the embodiment, front (or top) and back (or bottom) of each member may be defined with reference to the direction (e.g., third direction DR3) in which the image is displayed. The front and rear surfaces may be opposed to each other in the third direction DR3, and normal directions of the front and rear surfaces may be parallel to the third direction DR3. A separation distance in the third direction DR3 between the front and rear surfaces may correspond to a thickness in the third direction DR3 of the display panel.

The display device 1000 according to the embodiment may detect a user's input (e.g., touch event or hand in FIG. 1) applied from the outside. A user's input may include various types of external inputs such as a part of the user's body, light, heat, touch, or pressure. In the embodiment, the user's input may be shown with the user's hand (e.g., finger) applied to the front. However, the disclosure is not limited thereto. The user's input may be provided in various forms, and the display device 1000 may detect the user's input applied to a side or the rear surface of the display device 1000 according to the structure of the display device 1000.

Referring to FIGS. 1 and 2, the display device 1000 may include the cover window WU, a housing HM, a display panel DP, and an optical element ES. In the embodiment, the cover window WU and housing HM may be combined to configure an appearance of the display device 1000.

The cover window WU may include an insulation panel (e.g., electrically insulation panel). For example, the cover window WU may be made of glass, plastic, or a combination thereof.

The front surface of the cover window WU may define a front of the display device 1000. A transmissive area TA of the display panel 1000 may be an optically transparent region. For example, the transmissive area TA may be a region having visible ray transmittance of about 90% or more.

A blocking area BA of the display panel 1000 may define a shape of the transmissive area TA. The blocking area BA may be adjacent to the transmissive area TA and may surround the transmissive area TA. The blocking area BA may be a region having relatively low light transmittance compared to the transmissive area TA. The blocking area BA may include an opaque material that blocks light. The blocking area BA may have a color. The blocking area BA may be defined by a bezel layer provided separately from a transparent substrate defining the transmissive area TA. In some embodiments, the blocking area BA may be defined by an ink layer formed by inserting or coloring the transparent substrate.

The display panel DP may display an image, and may further include a driver 50. The display panel DP may include a front surface including a display area DA and a peripheral area PA. The display area DA may be a region in which a pixel PX operates according to an electrical signal and emits light.

In the embodiment, the display area DA may be a region in which an image is displayed. The display area DA may include a pixel PX. The display area DA may be a region in which an external input is sensed by a touch sensor positioned on an upper side in the third direction DR3 of the pixel PX. For example, the display area DA may simultaneously display the image and sense the external input.

The transmissive area TA of the cover window WU may at least partially overlap the display area DA of the display panel DP in a plan view. For example, the transmissive area TA may overlap the front surface of the display area DA or may overlap at least a portion of the display area DA in a plan view. Accordingly, the user may recognize an image through the transmissive area TA or provide an external input based on the image. However, the disclosure is not limited thereto. For example, in the display area DA, a region where an image is displayed and a region where an external input is sensed may be separated from each other.

The peripheral area PA of the display panel DP may at least partially overlap the blocking area BA of the cover window WU in a plan view. The peripheral area PA may be a region covered by the blocking area BA. The peripheral area PA may be adjacent to the display area DA and may surround the display area DA. An image may not be displayed in the peripheral area PA, and a driving circuit or driving wire for driving the display area DA may be disposed in the peripheral area PA. The peripheral area PA may include a first peripheral area PA1 and a second peripheral area PA2. A driver 50, a connecting wire, and a bending region may be disposed in the first peripheral area PA1. The second peripheral area PA2 may be positioned outside the display area DA. In the embodiment of FIG. 2, the second peripheral area PA2 may be positioned on a third side of the display area DA, and the first peripheral area PA1 may be positioned on another side of the display area DA.

In the embodiment, the display area DA and the peripheral area PA may face the cover window WU, and the display panel DP may be assembled in a flat state. However, the disclosure is not limited thereto. A part of the peripheral area PA of the display panel DP may be bent. The part of the peripheral area PA may face the rear surface of the display device 1000, and the blocking area BA shown on the front surface of the display device 1000 may be reduced. In FIG. 2, after the second peripheral area PA2 is bent and positioned on a back side of the display area DA, the display device 1000 may be assembled.

The display panel DP may include an element area EA. For example, the display panel DP may include a first component area EA1 and a second component area EA2. The first component area EA1 and the second component area EA2 may be at least partially surrounded by the display area DA. Although the first component area EA1 and the second component area EA2 are illustrated to be spaced apart from each other, the disclosure is not limited thereto and at least part of them may be electrically connected. The first component area EA1 and the second component area EA2 may be areas in which components (e.g., photosensors, speakers, or the like) using infrared rays, visible rays, sound, and the like are disposed thereunder.

In the display area DA, light emitting elements and pixel circuit portions for generating and transmitting a light emitting current to each of light emitting elements may be formed. A light emitting element and a pixel circuit portion may be referred to as a pixel PX. In the display area DA, a pixel circuit portion and a light emitting element may be formed on a one-to-one basis. For example, each of the pixel circuit portions may correspond to each of the light emitting elements in the display area DA.

The first component area EA1 may include a region formed of a transparent layer, and light may pass through the first component area EA1. The first component area EA1 may have a structure in which the light is not blocked. A conductive layer or a semiconductor layer may not be positioned in the first component area EA1. A partition wall, a light blocking layer, and the like may include a light blocking material and have an opening that overlaps a position corresponding to the first component area EA1 in a plan view.

The second component area EA2 may include a transmissive portion through which light or/and sound may pass and a display portion including the pixels PX. The transmitting portion (or transmissive portion) may be positioned between adjacent pixels PX and formed of a transparent layer through which light or/and sound may pass. The display portion may be formed to have a structure by adding multiple pixels PX. For example, the multiple pixels PX may be grouped to form the structure of the display portion. The transmissive portion may be positioned between adjacent structures.

Referring to FIGS. 1 to 3, the display panel DP may include the display area DA including a display pixel (e.g., pixel PX) and a touch sensor TS. The display panel DP may include the pixels PX that generate the image, and may be visually recognized by a user from the outside through the transmissive area TA. The touch sensor TS may be positioned on an upper portion of the pixel PX, and may sense an external input applied from the outside. The touch sensor TS may detect an external input provided to the cover window WU.

Referring back to FIG. 2, the first peripheral area PA1 may include a bending portion. The display area DA and the second non-display area PA2 may have a flat state substantially parallel to a plane defined by the first direction DR1 and the second direction DR2. A side of the first peripheral area PA1 may extend from the flat state, pass through the bending portion, and have a flat state again. As a result, at least a portion of the first peripheral area PA1 may be bent and assembled to be positioned on the back side of the display area DA. At least a portion of the first peripheral area PA1 may overlap the display area DA in a plan view in case that the display panel DP is assembled, and thus the blocking area BA of the display device 1000 may be reduced. However, the disclosure is not limited thereto. For example, the first peripheral area PA1 may not be bent.

The driver 50 may be mounted on the first peripheral area PA1, and may be mounted on a bending part or positioned on one of sides (e.g., both sides) of the bending part. The driver 50 may be provided in the form of a chip.

The driver 50 may be electrically connected to the display area DA to transmit an electrical signal to the display area DA. For example, the driver 50 may provide data signals to pixels PX disposed to the display area DA. In some embodiments, the driver 50 may include a touch driving circuit and may be electrically connected to a touch sensor TS disposed in the display area DA. The driver 50 may include various circuits in addition to the above-described circuits or may be designed to provide various electrical signals to the display area DA.

The display device 1000 may have a pad portion positioned at an end of the first peripheral area PA1, and may be electrically connected to a flexible printed circuit board (FPCB) including a driving chip through the pad portion. The driving chip positioned on the flexible printed circuit board may include various driving circuits for driving the display device 1000 or connectors for supplying power. Depending on embodiments, instead of the flexible printed circuit board, a rigid printed circuit board (PCB) may be used.

An optical element ES may be disposed under the display panel DP. The optical element ES may include a first optical element ES1 overlapping the first component area EA1 and a second optical element ES2 overlapping the second component area EA2 in a plan view.

The first optical element ES1 may be an electron element using light or sound. For example, the first optical element ES1 may be a sensor, a small lamp, a speaker, or the like. The sensor of the first optical element ES1 may receive and use light, and may include an infrared sensor. In some embodiments, the sensor of the first optical element ES1 may include a sensor that outputs and senses light or sound to measure a distance or a sensor that recognizes a fingerprint, and the like. The small lamp may output light. The speaker may output a sound and the like. In case that the first optical element ES1 includes an electronic element using light, light of various wavelength bands such as visible light, infrared light, and ultraviolet (UV) light can be used.

The second optical element ES2 may be at least one of a camera, an infrared (IR) camera, a dot projector, an infrared illuminator, and a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. In FIG. 3, among the configuration of the display panel DP, the display pixel (e.g., pixel PX of FIG. 2) and the touch sensor TS positioned in the display area DA are shown as an example.

The power supply module PM may supply power required for the overall operation of the display device 1000. The power supply module PM may include a battery module.

The first electronic module EM1 and the second electronic module EM2 may include various functional modules for operating the display device 1000. The first electronic module EM1 may be mounted (e.g., directly mounted (or mounted directly)) on a motherboard electrically connected to the display panel DP. In another embodiment, the first electronic module EM1 may be mounted on a substrate and electrically connected to the motherboard through a connector (not shown).

The first electronic module EM1 may include a control module CM, a wireless communication module TM, an image input module IIM, an audio input module AIM, a memory MM, and an external interface IF. Some of the modules may not be mounted on the motherboard, but may be electrically connected to the motherboard through the FPCB connected thereto.

The control module CM may control the overall operation of the display device 1000. The control module CM may be a microprocessor. For example, the control module CM may activate or deactivate the display panel DP. The control module CM may control other modules such as the image input module IIM or the audio input module AIM based on a touch signal received from the display panel DP.

The wireless communication module TM may transmit and/or receive a wireless signal with another terminal using a Bluetooth or Wi-Fi line. The wireless communication module TM may transmit and/or receive voice signals using a communication line. The wireless communication module TM may include a transmitter TM1 that modulates and transmits a signal to be transmitted, and a receiver TM2 that demodulates a received signal.

The image input module IIM may process a video signal and convert the processed signal (e.g., processed video signal) into image data that may be displayed on the display panel DP. The audio input module AIM may receive an external sound signal input by a microphone in a recording mode, a voice recognition mode, and the like and convert the received signal into electrical voice data.

The external interface IF may serve as an interface connected to an external charger, a wired/wireless data port, a card socket (e.g., a memory card, a SIM/UIM card), and the like.

The second electronic module EM2 may include an audio output module AOM, a light emitting module LM, a light receiving module LRM, and a camera module CMM. At least some of the audio output module AOM, the light emitting module LM, the light receiving module LRM, and the camera module CMM may be optical elements ES, which may be positioned on a back side of the display panel DP as shown in FIGS. 1 and 2. The optical element ES may include a light emitting module LM, a light receiving module LRM, and a camera module CMM. The second electronic module EM2 may be mounted (e.g., directly mounted) on the motherboard. In an embodiment, the second electronic module EM2 may be mounted on a separate substrate and electrically connected to the display panel DP through a connector (not shown). In some embodiments, the second electronic module EM2 may be electrically connected to the first electronic module EM1.

The audio output module AOM may convert audio data received from the wireless communication module TM or audio data stored in the memory MM into a sound, and output the sound to the outside.

The light emitting module LM may generate light and output the generated light. The light emitting module LM may output infrared light. For example, the light emitting module LM may include an LED element. For example, the light receiving module LRM may detect infrared light. The light receiving module LRM may be activated in case that the infrared light, which is above a level (e.g., a predetermined or selected level), is detected. The light receiving module LRM may include a CMOS sensor. After infrared light generated by the light emitting module LM is output, the infrared light may be reflected by an external subject (e.g., a user's finger or face), and the reflected infrared light may be incident on the light receiving module LRM. The camera module CMM may take an external image.

In the embodiment, the optical element ES may additionally include a light sensing sensor (or photosensor) or a thermal sensing sensor (or temperature sensor). The optical element ES may detect an external object received through the front side or provide a sound signal such as voice through the front side to the outside. The optical element ES may include various configurations, and is not limited to the embodiment.

Referring back to FIG. 2, the housing HM may be combined with the cover window WU. The cover window WU may be disposed in front of the housing HM. The housing HM may be combined with the cover window WU to provide a space (e.g., accommodation space or inner space). The display panel DP and optical element ES may be accommodated (or disposed) in the space (e.g., accommodation space or inner space) provided between the housing HM and the cover window WU.

The housing HM may contain a material with relatively high stiffness. For example, the housing HM may include frames and/or plates made of glass, plastic, metal, or a combination thereof. The housing HM may reliably protect the components of the display device 1000 accommodated in the inner space from external impact.

Figure 4:
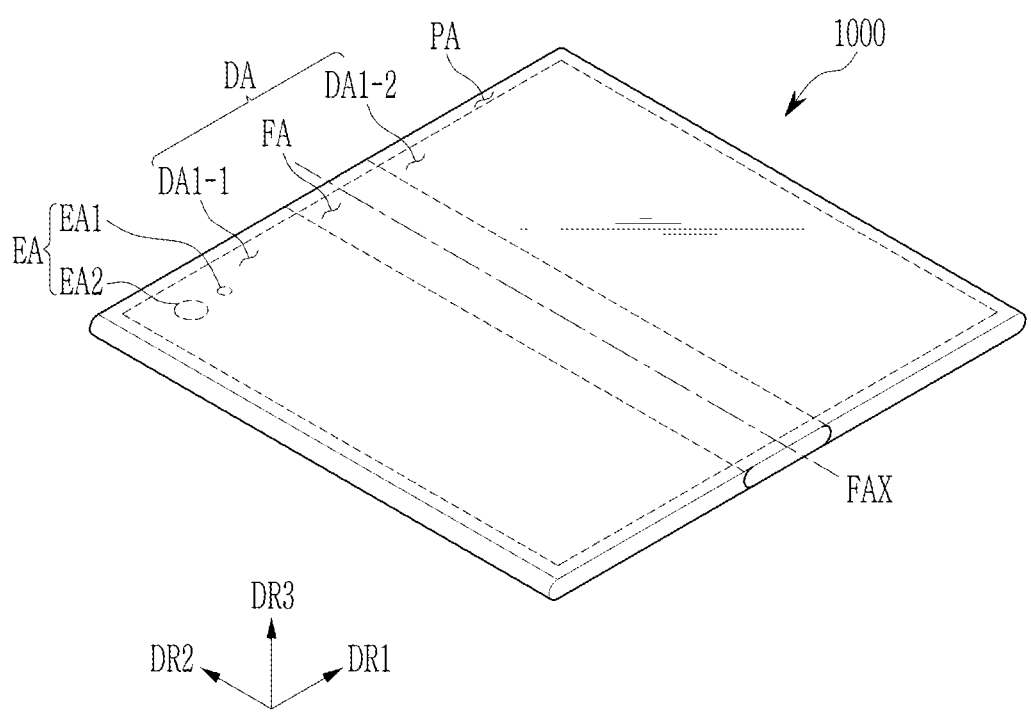
FIG. 4 is a schematic perspective view of a display device according to another embodiment.

A structure of a display device 1000 according to another embodiment is described with reference to FIG. 4. FIG. 4 is a schematic perspective view of a display device according to another embodiment. A description of the above-described element and the same configuration will be omitted.

In the embodiment of FIG. 4, a foldable display device with a structure in which a display device 1000 is folded along a folding axis FAX is illustrated.

Referring to FIG. 4, the display device 1000 may be a foldable display device. The display device 1000 may be folded outward or inward with reference to the folding axis FAX. In case that the display device 1000 is folded outward with reference to the folding axis FAX, a display plane of the display device 1000 may be positioned outward in a third direction DR3, and thus images may be displayed in both directions (e.g., third direction DR and opposite direction thereto). In case that the display device 1000 is folded inward with reference to the folding axis FAX, the display plane may not be visible from the outside.

In the embodiment, the display device 1000 may include a display area DA, an element area EA, and a peripheral area PA. The display area DA may be divided into a 1-1 display area DA1-1, a 1-2 display area DA1-2, and a folding area FA. The 1-1 display area DA1-1 and the 1-2 display area DA1-2 may be positioned on left and right sides of the folding axis FAX as a reference (or at the center thereof), respectively, and the folding area FA may be positioned between the 1-1 display area DA1-1 and the 1-2 the display areas DA1-2. In case that the display device 1000 is folded outward with reference to the folding axis FAX, the 1-1 display area DA1-1 and the 1-2 display area DA1-2 may be positioned on sides (e.g., both sides) of the folded display device 1000 in the third direction DR3, and images may be displayed in both directions (e.g., third direction DR3 and opposite direction thereto). In case that the display device 1000 is folded inward with reference to the folding axis FAX, the 1-1 display area DA1-1 and the 1-2 display area DA1-2 may not be visible from the outside.

Figure 5:
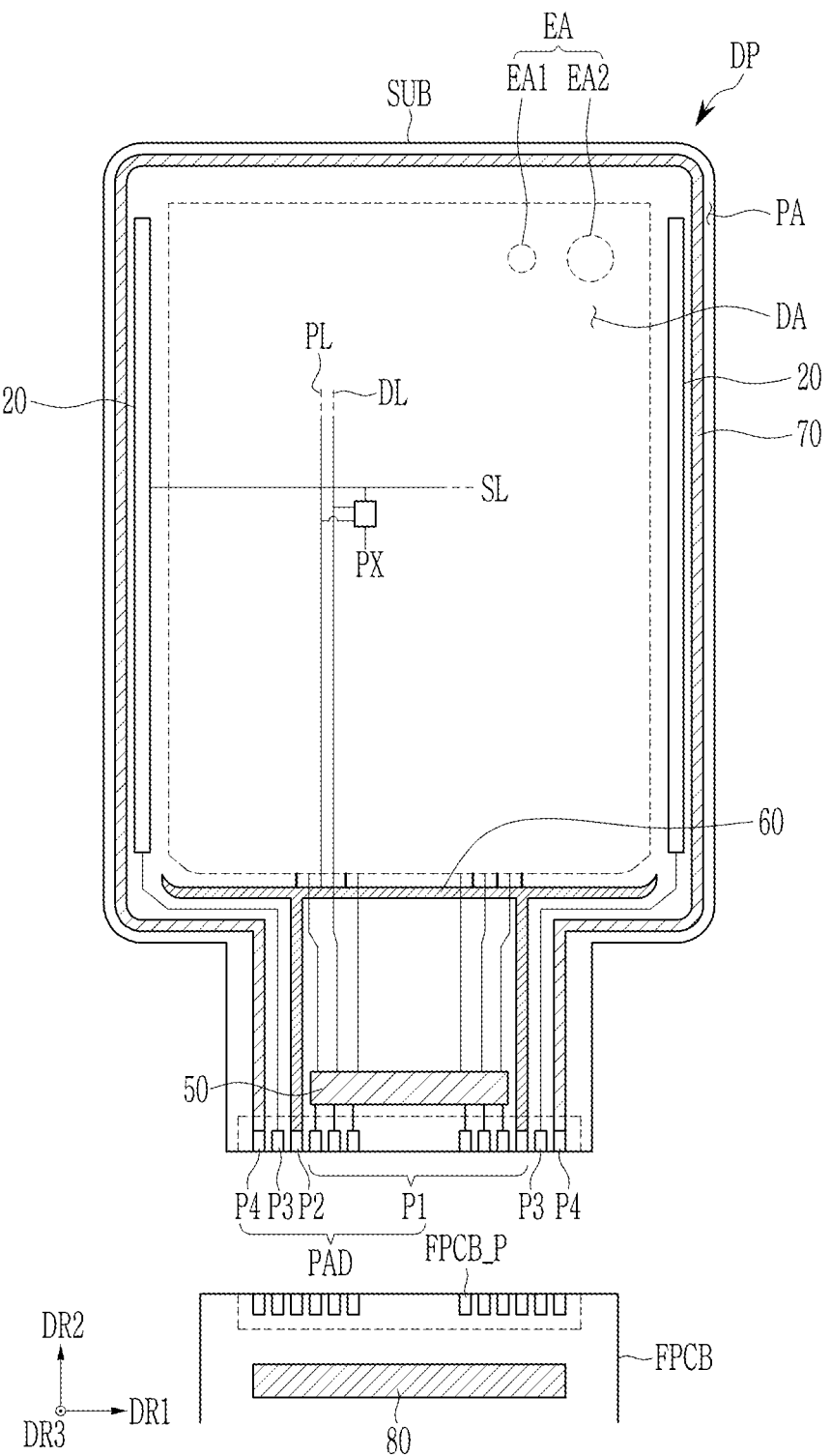
FIG. 5 is a schematic plan view of some elements of the display panel according to the embodiment.

A structure of the display panel DP is described in detail with reference to FIG. 5. FIG. 5 is a schematic plan view of some elements of the display panel according to the embodiment.

Referring to FIG. 5, the display panel DP may include a display area DA, element area EA and a peripheral area PA, and the peripheral area PA may be defined along an edge of the display area DA.

The display panel DP may include pixels PX. The pixels PX may be disposed in the display area DA. Each pixel PX may include a light emitting element and a pixel circuit portion connected to the light emitting element. Each pixel PX may emit light of various colors (e.g., red, green, blue, white, or the like), and may include, for example, an organic light emitting diode.

The display panel DP may include signal lines and a pad portion PAD. The signal lines may include a scan line SL extending in a first direction DR1, a data line DL extending in a second direction DR2, a driving voltage line PL, and the like.

A scan driver 20 may be positioned on left and right of the display area DA. The scan driver 20 may generate and transmit a scan signal to each pixel PX through the scan line SL. The pixel PX may receive scan signals from two scan drivers 20 positioned on the left and right sides together.

The pad portion PAD may be disposed at an end of the peripheral area PA of the display panel DP, and may include terminals P1, P2, P3, and P4. The pad portion PAD may be referred to as a circuit board pad portion. The pad portion PAD may be exposed without being covered by an insulation layer, and thus may be electrically connected to a flexible printed circuit board FPCB. The pad portion PAD may be electrically connected to a pad portion FPCB_P of the flexible printed circuit board FPCB. The flexible printed circuit board FPCB may transmit a signal or power of an IC driving chip 80 to the pad portion PAD.

The IC driving chip 80 may convert image signals transmitted from the outside into image data signals, and transmit the changed signal to a data driver 50 through the terminal P1. The IC driving chip 80 may receive a vertical synchronization signal, a horizontal synchronization signal, and a clock signal. The IC driving chip 80 may generate a control signal to control the driving of the scan driver 20 and the data driver 50, and transmit the control signal to each of the scan driver 20 and the data driver 50 through the terminals P3 and P1. The IC driving chip 80 may transmit a driving voltage ELVDD to a driving voltage supply wire 60 through the terminal P2. The IC driving chip 80 may transmit a common voltage ELVSS to each of a common voltage supply wire 70 through the terminal P4.

The data driver 50 may be disposed in the peripheral area PA. The data driver 50 may generate data voltage DATA to be applied to each pixel PX and transmit the data voltage DATA to each data line DL. The data driver 50 may be disposed at a side of the display panel DP. For example, the data driver 50 may be disposed between the pad portion PAD and the display area DA. Referring to FIG. 5, a data line DL electrically connected to pixels PX other than the pixels PX disposed above and below the element area EA in the second direction DR2, may extend in the second direction DR2 and thus have a straight-line structure. On the contrary, a data line DL connected to the pixels PX disposed above and below the element area EA may include a portion extending in the second direction DR2 and another portion extending along a periphery of the element area EA.

The driving voltage supply wire 60 may be disposed in the peripheral area PA. For example, the driving voltage supply wire 60 may be disposed between the data driver 50 and the display area DA. The driving voltage supply wire 60 may provide the driving voltage ELVDD to the pixels PX. The driving voltage supply wire 60 may be disposed in the first direction DR1 and may be electrically connected to multiple driving voltage lines PL disposed in the second direction DR2.

The common voltage supply wire 70 may be disposed in the peripheral area PA. The common voltage supply wire 70 may have a shape surrounding the substrate SUB. The common voltage supply wire 70 may transmit the common voltage ELVSS to an electrode (e.g., cathode) of the light emitting diode included in the pixel PX.

Figure 6:
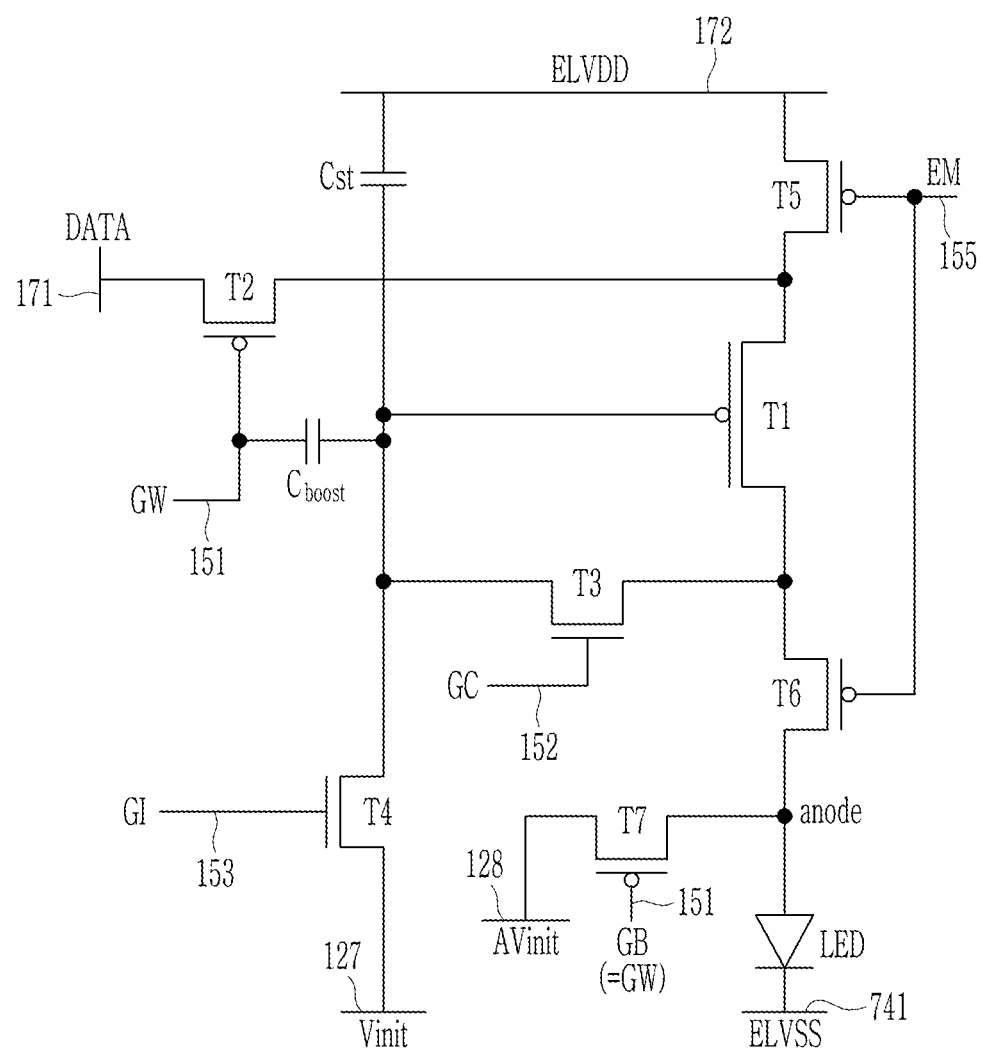
FIG. 6 is a schematic diagram of an equivalent circuit of a pixel included in the display panel according to the embodiment.

An example of the circuit structure of the pixel PX positioned on the display panel DP is described below with reference to FIG. 6. FIG. 6 is a schematic diagram of an equivalent circuit of a pixel included in the display panel according to the embodiment.

A circuit structure shown in FIG. 6 is a circuit structure of a pixel circuit portion and a light emitting element formed in a part of the display area DA and the element area EA.

A pixel PX (e.g., refer to FIG. 5) according to the embodiment may include transistors T1, T2, T3, T4, T5, T6, and T7 electrically connected to wires 127, 128, 151, 152, 153, 155, 171, 172, and 741, a storage capacitor Cst, a boost capacitor $C_{boost}$, and a light emitting diode LED. Transistors T1, T2, T3, T4, T5, T6, and T7 and capacitors Cst and $C_{boost}$ may form a pixel circuit portion. For example, the pixel circuit portion may not include the light emitting diode LED. Depending on embodiments, the boost capacitor $C_{boost}$ may be omitted.

Each pixel PX (e.g., refer to FIG. 5) may be electrically connected with wires 127, 128, 151, 152, 153, 155, 171, 172, and 741. The wires may include a first initialization voltage line 127, a second initialization voltage line 128, a first scan line 151, a second scan line 152, an initialization control line 153, a light emission control line 155, a data line 171, a driving voltage line 172, and a common voltage line 741. The first scan line 151 may be electrically connected to a seventh transistor T7 and a second transistor T2, but depending on embodiments, the seventh transistor T7 may be electrically connected through a separate bypass control line unlike the second transistor T2.

The first scan line 151 may be electrically connected to a scan driver (not shown) and transmit a first scan signal GW to the second transistor T2 and the seventh transistor T7. A voltage of opposite polarity of a voltage applied to the first scan line 151 may be applied to the second scan line 152 at the same timing as the signal of the first scan line 151. For example, in case that a negative voltage is applied to the first scan line 151, a positive voltage may be applied to the second scan line 152. The second scan line 152 may transmit a second scan signal GC to a third transistor T3. An initialization control line 153 may transmit an initialization control line GI to a fourth transistor T4. A light emission control line 155 may transmit a light emission control signal EM to a fifth transistor T5 and a sixth transistor T6.

The data line 171 may be a wire that transmits a data voltage DATA generated by a data driver (not shown). Accordingly, in case that an intensity of a light emitting current transmitted to the light emitting diode LED changes, a luminance of the light emitting diode LED may also change. The driving voltage line 172 may apply (or transmit) the driving voltage ELVDD. The first initialization voltage line 127 may transmit a first initialization voltage Vinit, and the second initialization voltage line 128 may transmit a second initialization voltage AVinit. The common voltage line 741 may apply the common voltage ELVSS to a cathode of the light emitting diode LED. In the embodiment, the driving voltage line 172, the first and second initialization voltage lines 127 and 128, and the common voltage line 741 may be respectively applied with constant voltages.

A driving transistor T1 may be a P-type transistor and have a silicon semiconductor as a semiconductor layer. The driving transistor T1 may be referred to as a first transistor. For example, the driving transistor T1 may be a transistor that adjusts intensity of a light emitting current output to an anode of the light emitting diode LED according to the magnitude of a voltage (i.e., a voltage stored in the storage capacitor Cst) of a gate electrode of the driving transistor T1. Since brightness of the light emitting diode LED is adjusted according to the intensity of the light emitting current output to the anode of the light emitting diode LED, luminance of the light emitting diode LED may be adjusted according to the data voltage DATA applied to the pixel PX (e.g., refer to FIG. 5). Thus, a first electrode of the driving transistor T1 may be disposed to be applied with the driving voltage ELVDD, and thus may be electrically connected with the driving voltage line 172 via the fifth transistor T5. The first electrode of the driving transistor T1 may be electrically also connected with a second electrode of the second transistor T2 and thus also receive the data voltage DATA. The second electrode of the driving transistor T1 may output the light emitting current to the light emitting diode LED and thus may be electrically connected with the anode of the light emitting diode LED via the sixth transistor T6. The sixth transistor T6 may be referred to as an output control transistor. The second electrode of the driving transistor T1 may be also electrically connected with the third transistor T3 and thus transmit the data voltage DATA applied to a first electrode to the third transistor T3. The gate electrode of the driving transistor T1 may be electrically connected with an electrode of the storage capacitor Cst. The electrode of the storage capacitor Cst, which is electrically connected to the gate electrode of the driving transistor T1, may be referred to as a second storage electrode. Thus, the voltage of the gate electrode of the driving transistor T1 may change according to a voltage stored in the storage capacitor Cst, and accordingly, a light emitting current output from the driving transistor T1 may change. The storage capacitor Cst may maintain the voltage of the gate electrode of the driving transistor T1 constant for a frame. The gate electrode of the driving transistor T1 may be also electrically connected with the third transistor T3, and the data voltage DATA applied to the first electrode of the driving transistor T1 may pass through the third transistor T3 and may be transmitted to the gate electrode of the driving transistor T1. The gate electrode of the driving transistor T1 may be also electrically connected with the fourth transistor T4. Thus, the gate electrode of the driving transistor T1 may receive a first initialization voltage Vinit and may be initialized.

The second transistor T2 may be a P-type transistor and have a silicon semiconductor as a semiconductor layer. The second transistor T2 may be a transistor that receives the data voltage DATA into the pixel PX (e.g., refer to FIG. 5). For example, the data voltage DATA may be input into the pixel PX (e.g., refer to FIG. 5) through the second transistor T2. A gate electrode of the second transistor T2 may be electrically connected with the first scan line 151 and an electrode of the boost capacitor $C_{boost}$. The electrode of the boost capacitor $C_{boost}$ may be referred to as a lower boost electrode. A first electrode of the second transistor T2 may be electrically connected with the data line 171. A second electrode of the second transistor T2 may be electrically connected with the first electrode of the driving transistor T1. In case that the second transistor T2 is turned on by a negative voltage of the first scan signal GW transmitted through the first scan line 151, the data voltage DATA transmitted through data line 171 may be transmitted to the first electrode of the driving transistor T1. The data voltage DATA may be transmitted to the gate electrode of the driving transistor T1 and stored in the storage capacitor Cst.

The third transistor T3 may be an N-type transistor and have an oxide semiconductor as a semiconductor layer. The third transistor T3 may electrically connect the second electrode of the driving transistor T1 and the gate electrode of the driving transistor T1. As a result, the data voltage DATA may be compensated by a threshold voltage of the driving transistor T1 and stored in a second storage electrode of the storage capacitor Cst. A gate electrode of the third transistor T3 may be electrically connected to the second scan line 152, and the first electrode of the third transistor T3 may be electrically connected to the second electrode of the driving transistor T1. A second electrode of the third transistor T3 may be electrically connected with the second storage electrode of the storage capacitor Cst, the gate electrode of the driving transistor T1, and another electrode of the boost capacitor $C_{boost}$. The another electrode of the boost capacitor $C_{boost}$ may be referred to as an upper boost capacitor. The third transistor T3 may be turned on by a positive voltage of a second scan signal GC received through the second scan line 152, and connect the gate electrode of the driving transistor T1 and the second electrode of the driving transistor T1. The third transistor T3 may transmit the voltage applied to the gate electrode of the driving transistor T1 to the second storage electrode of the storage capacitor Cst, and store the transmitted voltage in the storage capacitor Cst. The voltage stored in the storage capacitor Cst may be the voltage of the gate electrode of the driving transistor T1 in case that the driving transistor T1 is turned off. Thus, the voltage may be stored in the storage capacitor Cst in a state in which a threshold voltage Vth of the driving transistor T1 is compensated.

The fourth transistor T4 may be an N-type transistor and have an oxide semiconductor as a semiconductor layer. The fourth transistor T4 may initialize the gate electrode of the driving transistor T1 and the second storage electrode of the storage capacitor Cst. A gate electrode of the fourth transistor T4 may be electrically connected with the initialization control line 153, and a first electrode of the fourth transistor T4 may be electrically connected with the first initialization voltage line 127. A second electrode of the fourth transistor T4 may be electrically connected to the second electrode of the third transistor T3, the second storage electrode of the storage capacitor Cst, the gate electrode of the driving transistor T1, and the upper boost electrode of the boost capacitor $C_{boost}$. The fourth transistor T4 may be turned on by a positive voltage in the initialization control line GI received through the initialization control line 153. The first initialization voltage Vinit may be applied to the gate electrode of the driving transistor T1, the second storage electrode of the storage capacitor Cst, and the upper boost electrode of the boost capacitor $C_{boost}$ for initialization.

The fifth transistor T5 and the sixth transistor T6 may be P-type transistors, and have a silicon semiconductor as a semiconductor layer.

The fifth transistor T5 may transmit the driving voltage ELVDD to the driving transistor T1. A gate electrode of the fifth transistor T5 may be electrically connected to the light emission control line 155. A first electrode of the fifth transistor T5 may be electrically connected with the driving voltage line 172. A second electrode of the fifth transistor T5 may be electrically connected with the first electrode of the driving transistor T1.

The sixth transistor T6 may transmit the light emitting current output from the driving transistor T1 to the light emitting diode LED. A gate electrode of the sixth transistor T6 may be electrically connected with the light emission control line 155. A first electrode of the sixth transistor T6 may be electrically connected with the second electrode of the driving transistor T1. A second electrode of the sixth transistor T6 may be electrically connected with the anode of the light emitting diode LED.

The seventh transistor T7 may be a P-type or N-type transistor, and have a silicon semiconductor or oxide semiconductor as a semiconductor layer. The seventh transistor T7 may initialize the anode of the light emitting diode LED. A gate electrode of the seventh transistor T7 may be electrically connected with the first scan line 151. A first electrode of the seventh transistor T7 may be electrically connected with the anode of the light emitting diode LED. A second electrode of the seventh transistor T7 may be electrically connected with the second initialization voltage line 128. In case that the seventh transistor T7 is turned on by a negative voltage of the first scan line 151, the second initialization voltage AVinit may be applied to the anode of the light emitting diode LED. Thus, the anode of the light emitting diode LED may be initialized. The gate electrode of the seventh transistor T7 may be electrically connected to a separate bypass control line and controlled by a separate wire from the first scan line 151. Depending on embodiments, the second initialization voltage line 128 to which the second initialization voltage AVinit is applied may be the same as the first initialization voltage line 127 to which the first initialization voltage Vinit is applied.

Although it has been described that one pixel PX (e.g., refer to FIG. 5) includes seven transistors T1 to T7 and two capacitors (i.e., the storage capacitor Cst and the boost capacitor $C_{boost}$), the disclosure is not limited thereto, and the boost capacitor $C_{boost}$ may be omitted depending on embodiments. The third transistor T3 and the fourth transistor T4 are formed as the N-type transistor, but only one of these transistors (e.g., third transistor T3 and fourth transistor T4) may be formed as an N-type transistor or the other transistor may be formed as an N-type transistor. According to another embodiment, all or part of the seven transistors T1 to T7 may be changed to a P-type transistor or an N-type transistor.

Figure 7:
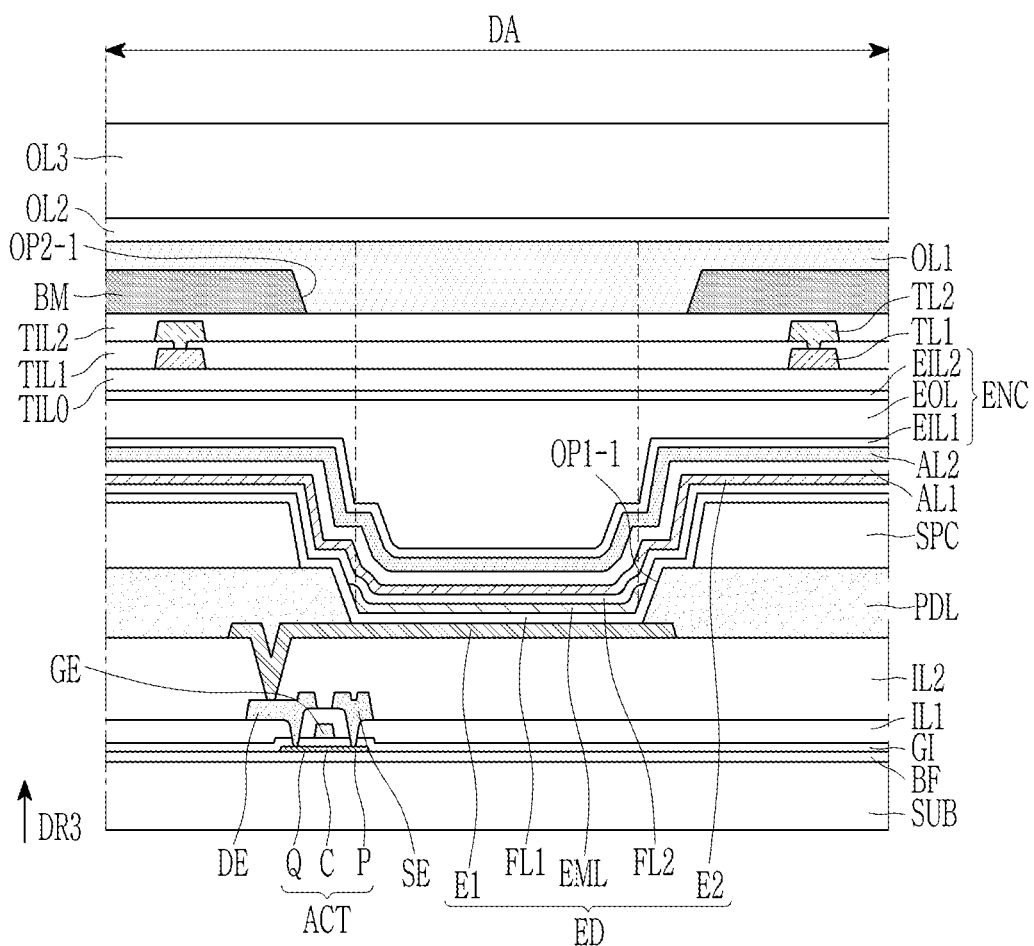
FIG. 7 is a schematic cross-sectional view of elements disposed in a display area according to an embodiment.
Figure 8:
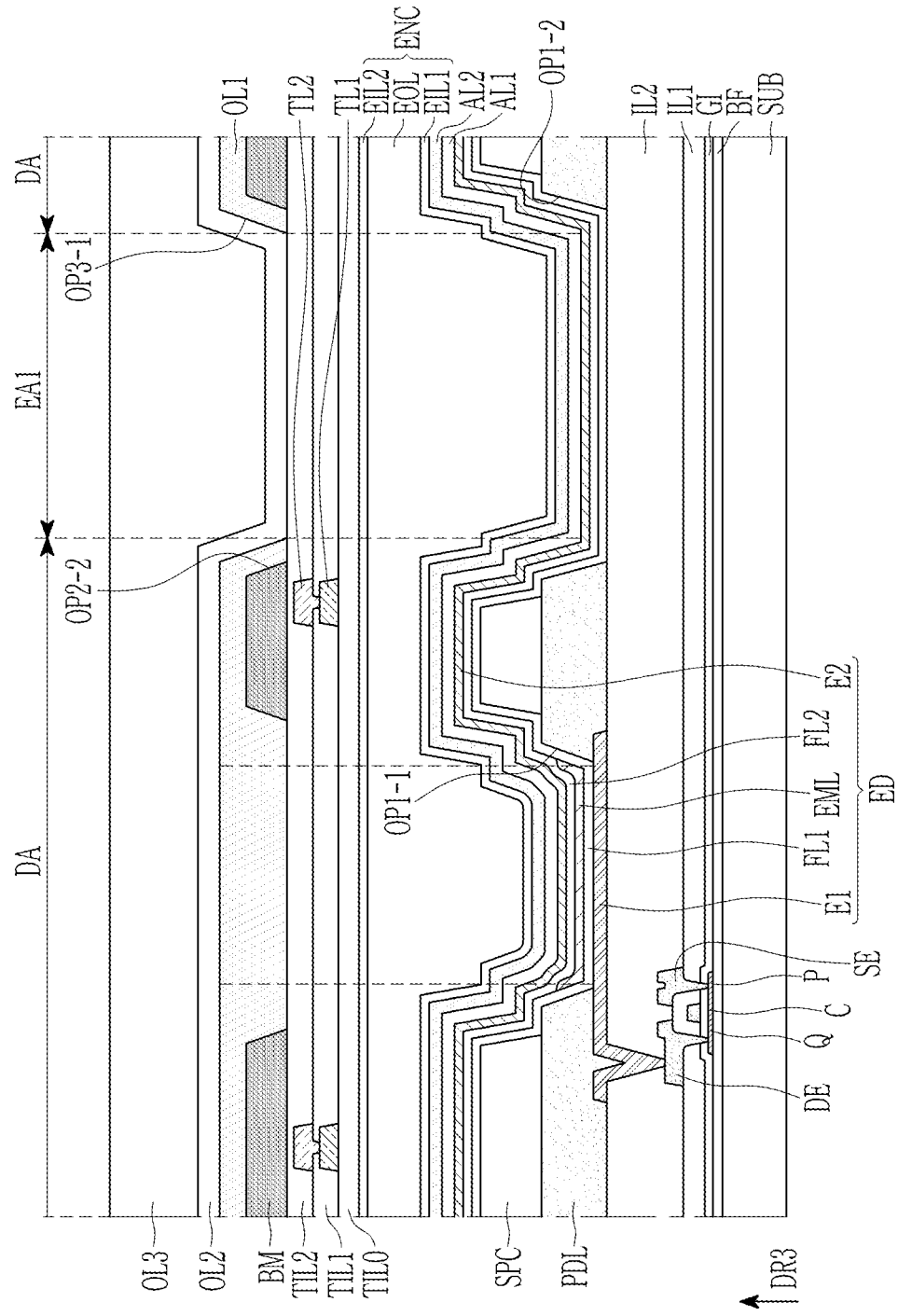
FIG. 8 is a schematic cross-sectional view of elements disposed in the display area and a first component area according to the embodiment.
Figure 9:
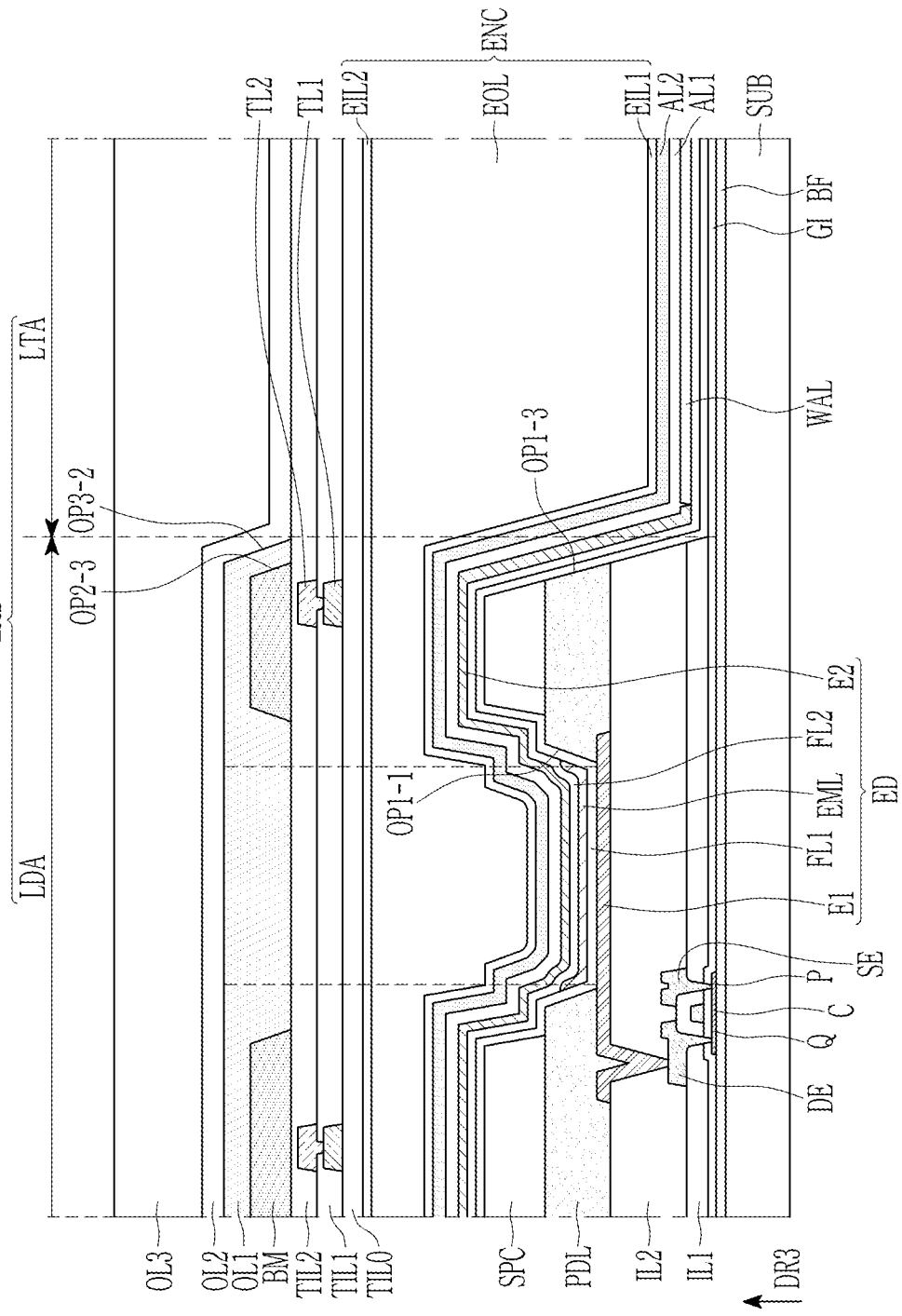
FIG. 9 is a schematic cross-sectional view of elements disposed in a second component area according to the embodiment.

Referring to FIGS. 7 to 9, a display panel according to an embodiment is described below. FIG. 7 is a schematic cross-sectional view of elements disposed in a display area according to an embodiment. FIG. 8 is a schematic cross-sectional view of elements disposed in the display area and a first component area according to the embodiment. FIG. 9 is a schematic cross-sectional view of elements disposed in a second component area according to the embodiment.

Referring to FIG. 7, description of a display area of a display panel is provided below.

A display panel according to an embodiment may include a substrate SUB. The substrate SUB may include an inorganic insulating material such as glass or an organic insulating material such as plastic such as polyimide (PI). The substrate SUB may be single-layered or multi-layered. The substrate SUB may have a structure in which at least one base layer containing a sequentially stacked polymer resin and at least one inorganic layer are alternately stacked each other.

The substrate SUB may have various degrees of flexibility. The substrate SUB may be a rigid substrate or a flexible substrate capable of bending, folding, or rolling.

A buffer layer BF may be positioned on the substrate SUB. The buffer layer BF may block permeation of impurity from the substrate SUB to an upper layer (e.g., semiconductor layer ACT) of the buffer layer BF. Thus, characteristic degradation of the semiconductor layer ACT may be prevented and stress (e.g., thermal or mechanical stress) thereof may be reduced. The buffer layer BF may include an inorganic insulating material or an organic insulating material such as silicon nitride or silicon oxide. A part or all of the buffer layer BF may be omitted.

The semiconductor layer ACT may be positioned on the buffer layer BF. The semiconductor layer ACT may include at least one of polysilicon and an oxide semiconductor. The semiconductor layer ACT may include a channel region C, a first region P, and a second region Q. The first region P and the second region Q may be respectively disposed on sides (e.g., both sides) of the channel region C. The channel region C may include a semiconductor doped with a small amount of impurity or undoped with impurity, and the first region P and the second region Q may include a semiconductor doped with a large amount of impurity compared to the channel region C. The semiconductor layer ACT may be formed of an oxide semiconductor. A separate protective layer (not shown) may be added to protect the oxide semiconductor material, which is vulnerable to external environments such as a high temperature.

A gate insulation layer GI may be positioned on the semiconductor layer ACT. The gate insulation layer GI may be single-layered or multi-layered with at least one of a silicon oxide ($SiO_x$), a silicon nitride ($SiN_x$), and a silicon oxynitride ($SiO_xN_y$).

A gate electrode GE may be positioned on the gate insulation layer GI. The gate electrode GE may be single-layered or multi-layered with at least one metal film of copper (Cu), copper alloy, aluminum (Al), an aluminum alloy, molybdenum (Mo), a molybdenum alloy, titanium (Ti), and a titanium alloy. The above-described metal films may be laminated. The gate electrode GE may overlap the channel region C of the semiconductor layer ACT in a plan view.

A first insulation layer IL1 may be positioned on the gate electrode GE and the gate insulation layer GI. The first insulation layer IL1 may be single-layered or multi-layered with at least one of a silicon oxide ($SiO_x$), a silicon nitride ($SiN_x$), and a silicon oxynitride ($SiO_xN_y$).

A source electrode SE and a drain electrode DE may be positioned on the first insulation layer IL1. The source electrode SE and the drain electrode DE may be respectively connected to the first region P and the second region Q of the semiconductor layer ACT through a contact hole formed in the first insulation layer IL1.

The source electrode SE and the drain electrode DE may include at least one of aluminum (Al), silver (Ag), magnesium (Mg), gold (Au), nickel (Ni), chromium (Cr), nickel (Ni), calcium (Ca), molybdenum (Mo), titanium (Ti), tungsten (W), and copper (Cu). The source electrode SE and the drain electrode DE may be single-layered or multi-layered, and include the above-described materials.

A second insulation layer IL2 may be positioned on the first insulation layer ILL the source electrode SE, and the drain electrode DE. The second insulation layer IL2 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, and siloxane-based polymers. However, the disclosure is not limited thereto. Although the second insulation layer IL2 formed in a single layer in the specification, the disclosure is not limited thereto and the second insulation layer IL2 may be formed in multiple layers.

A first electrode E1 may be positioned on the second insulation layer IL2. The first electrode E1 may be electrically connected to the drain electrode DE through a contact hole of the second insulation layer IL2.

The first electrode E1 may include a metal such as silver (Ag), lithium (Li), calcium (Ca), aluminum (Al), magnesium (Mg), or gold (Au). In some embodiments, the first electrode E1 may include a transparent conductive oxide (TCO) such as an indium tin oxide (ITO) and an indium zinc oxide (IZO). The first electrode E1 may be formed of a single layer including a metallic material or a transparent conductive oxide. In some embodiments, the first electrode E1 may be formed of a multi-layer including the above-described materials. For example, the first electrode E1 may have a triple layer structure of indium tin oxide (ITO)/silver (Ag)/indium tin oxide (ITO).

A transistor formed of the gate electrode GE, the semiconductor layer ACT, the source electrode SE, and the drain electrode DE may be electrically connected to the first electrode E1 to supply a current to a light emitting diode (e.g., emitting diode ED).

A partition wall PDL may be positioned on the second insulation layer IL2 and the first electrode E1.

The partition wall PDL may overlap at least a part of the first electrode E1 in a plan view, and have a 1-1 opening OP1-1 defining a light emitting region. The 1-1 opening OP1-1 may have a planar shape almost similar to that of the first electrode E1. The 1-1 opening OP1-1 may have a circular shape in a plan view, but is not limited thereto, and may have any shape such as a rhombic shape, an octagonal shape similar to a rhombus, a quadrangle, a polygon, an oval, and the like.

The partition wall PDL may contain an organic insulating material (or organic insulator). In some embodiments, the partition wall PDL may include at least one inorganic insulating material such as a silicon nitride, a silicon oxynitride, and a silicon oxynitride. In some embodiments, the partition wall PDL may include an organic insulating material and an inorganic insulating material. In the embodiment, the partition wall PDL may contains a light blocking material and may be provided in black. The light blocking material may include at least one of carbon black, carbon nanotubes, a resin containing black dye, or a paste, or metal particles, for example, of nickel, aluminum, molybdenum, and alloys thereof, metal oxide particles (e.g., a chromium oxide), and metal nitride particles (e.g., a chromium nitride). However, the disclosure is not limited thereto. In case that the partition wall PDL includes a light blocking material, the partition wall PDL may reduce reflection of external light by the metal structures (e.g., first electrode E1) disposed under the partition wall PDL. However, the disclosure is not limited thereto. In another embodiment, the partition wall PDL may not contain a light-blocking material, but may contain a light-transmitting organic insulating material.

A spacer SPC may be disposed on the partition wall PDL. The spacer SPC may contain an organic insulating material such as a polyimide. In some embodiments, the spacer SPC may include an inorganic insulating material such as a silicon nitride ($SiN_x$) or a silicon oxide ($SiO_2$). The spacer SPC may include an organic insulating material, an inorganic insulating material, and a combination thereof.

In an embodiment, the spacer SPC and the partition wall PDL may include a same material. The partition wall PDL and the spacer SPC may be formed together in a mask process using a halftone mask or the like. In an embodiment, the partition wall PDL and spacer SPC may contain different materials from each other.

An emission layer EML may be positioned on the first electrode E1. The emission layer EML may contain organic and/or inorganic materials. The emission layer EML may generate light of a color. The emission layer EML may be formed to be positioned only within the 1-1 opening OP1-1 of the partition wall PDL using a mask or inkjet process.

A first function layer FL1 may be positioned between the emission layer EML and the first electrode E1, and a second function layer FL2 may be positioned between the emission layer EML and the second electrode E2.

The first function layer FL1 may include at least one of a hole injection layer (HIL) and a hole transport layer (HTL), and the second function layer FL2 may include at least one of an electron transport layer (ETL) and an electron injection layer (EIL).

While the emission layer EML is disposed for each pixel to correspond to the 1-1 opening OP1-1 of the partition wall PDL, the first function layer FL1 and the second function layer FL2 may be integral with each other to cover the substrate SUB as a whole. For example, the first function layer FL1 and the second function layer FL2 may be integral with each other to completely cover the display area DA of the substrate SUB, respectively.

A second electrode E2 may be positioned on the emission layer EML. The second electrode E2 may include a reflective metal include (or formed of) calcium (Ca), barium (Ba), magnesium (Mg), aluminum (Al), silver (Ag), gold (Au), nickel (Ni), chromium (Cr), lithium (Li), calcium (Ca), molybdenum (Mo), or the like, or a transparent conductive oxide (TCO) such as an indium tin oxide (ITO) or an indium zinc oxide (IZO). However, the disclosure is not limited thereto.

The first electrode E1, the emission layer EML, and the second electrode E2 may form an emitting diode ED. The first electrode E1 may be an anode that is a hole injection electrode, and the second electrode E2 may be a cathode that is an electron injection electrode. However, the embodiment is not limited thereto, and depending on a driving method of a light emitting display device, the first electrode E1 may become a cathode and the second electrode E2 may become an anode.

Holes and electrons may be respectively injected into the emission layer EML from the first electrode E1 and the second electrode E2. Light emission may occur in case that excitons combined with the injected holes and electrons fall from an exited state to a ground state.

A first capping layer AL1 may be positioned on the second electrode E2. The first capping layer AL1 may improve luminous efficiency of the emitting diode ED by the principle of reinforcing interference. The first capping layer AL1 may include a material having a refractive index of, for example, about 1.6 or more with respect to light having a wavelength of about 589 nm.

The first capping layer AL1 may be an organic capping layer including an organic material, an inorganic capping layer including an inorganic material, or a composite capping layer including an organic material and an inorganic material. The composite capping layer of the first capping layer AL1 may include a combination of the organic material and the inorganic material. For example, the first capping layer AL1 may include at least one of a carbocyclic compound, a heterocyclic compound, an amine group-containing compound, a porphine derivative, a phthalocyanine derivative, a naphthalocyanine derivatives, an alkali metal complex, and an alkaline earth metal complex. The first capping layer AL1 may include any combination of the above-described materials. At least one of carbocyclic compounds, heterocyclic compounds, and amine group-containing compounds may be optionally substituted with substituents including O, N, S, Se, Si, F, Cl, Br, I, or any combination of the above-described materials.

A low-reflective layer AL2 may be disposed on the first capping layer AL1. Since the first capping layer AL1 may be disposed on the emitting diode ED, the low-reflective layer AL2 may be disposed on the emitting diode ED. The low-reflective layer AL2 may overlap an entire surface of the substrate SUB in a plan view.

The low-reflective layer AL2 may include an inorganic material with low reflectance, and in an embodiment, the low-reflective layer AL2 may include a metal or a metal oxide. In case that the low-reflective layer AL2 contains a metal, the metal of the low-reflective layer AL2 may include at least one of ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), and calcium (Ca). The low-reflective layer AL2 may include an alloy or a combination of the above-described metals. In case that the low-reflective layer AL2 contains a metal oxide, the metal oxide of the low-reflective layer AL2 may include at least one of $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, $SiN_x$, LiF, $CaF_2$, $MgF_2$, CdS. The low-reflective layer AL2 may include a combination of the above-described metal oxides.

In the embodiment, an absorption coefficient (k) of the inorganic material included in the low-reflective layer AL2 may be about 4.0 or less and about 0.5 or more ($0.5 \leq k \leq 4.0$). The inorganic material included in the low-reflective layer AL2 may have a refractive index (n) of about 1 or more ($n \geq 1.0$).

The low-reflective layer AL2 may include destructive interference between the light incident inside the display device and the light reflected from the metal (e.g., first electrode E1) disposed under the low-reflective layer AL2. Thus, external light reflectance may be reduced. Therefore, the display quality and visibility of the display device may be improved by reducing the external light reflectance of the display device through the low-reflective layer AL2.

An encapsulation layer ENC may be positioned on the low-reflective layer AL2. The encapsulation layer ENC may cover and seal a top surface and side surfaces of the light emitting element. Since the emitting diode ED is very vulnerable to moisture and oxygen, the encapsulation layer ENC may seal the emitting diode ED to block the inflow of external moisture and oxygen.

The encapsulation layer ENC may include multiple layers. The encapsulation layer END may be formed as a composite film including an inorganic layer, an organic layer, or a combination thereof. For example, a first encapsulation inorganic layer EIL1, an encapsulation organic layer EOL, and a second encapsulation inorganic layer EIL2 may be sequentially formed, thereby forming a triple layer.

The first encapsulation inorganic layer EIL1 may cover the second electrode E2. The first encapsulation inorganic layer EIL1 may prevent external moisture or oxygen from penetrating into the light emitting element. For example, the first encapsulation inorganic layer EIL1 may include at least one of a silicon nitride, a silicon oxide, and a silicon oxynitride. The first encapsulation inorganic layer EIL1 may include a combination of the above-described materials. The first encapsulation inorganic layer EIL1 may be formed through a deposition process.

The encapsulation organic layer EOL may be disposed on the first encapsulation inorganic layer EIL1, and may contact the first encapsulation inorganic layer EIL1. Curves formed on the upper surface of the first encapsulation inorganic layer EIL1 or particles existing on the first encapsulation inorganic layer EIL1 may be covered by the encapsulation organic layer EOL, and thus the influence of the surface state (e.g., curves, particles, or the like) of an upper surface of the first encapsulation inorganic layer EIL1 may be prevented on components (e.g., first conductive layer TL1) formed in the encapsulation organic layer EOL. The encapsulation organic layer EOL may relieve (or reduce) stress between layers (e.g., first encapsulation inorganic layer EIL1, second encapsulation inorganic layer EIL2, or the like) contacting thereto. The encapsulation organic layer EOL may contain an organic material, and may be formed through a solution process such as spin coating, slit coating, or an inkjet process.

The second encapsulation inorganic layer EIL2 may be disposed on the encapsulation organic layer EOL to cover the encapsulation organic layer EOL. The second encapsulation inorganic layer EIL2 may be stably formed on a relatively flat surface of the encapsulation organic layer EOL. For example, the stability of the second encapsulation inorganic layer EIL2 disposed on the encapsulation organic layer EOL may be greater than that of a second encapsulation inorganic layer EIL2 disposed (e.g., directly disposed) on the first encapsulation inorganic layer EIL1. The second encapsulation inorganic layer EIL2 may encapsulate moisture emitted from the encapsulation organic layer EOL to prevent inflow of the moisture to the outside thereof. The second encapsulation inorganic layer EIL2 may include at least one of a silicon nitride, a silicon oxide, and a silicon oxynitride. For example, the second encapsulation inorganic layer EIL2 may include a combination of the above-described materials. The second encapsulation inorganic layer EIL2 may be formed through a deposition process.

A first insulation layer TIL0, a first conductive layer TL1, a first touch insulation layer TILL a second conductive layer TL2, and a second touch insulation layer TIL2 may be positioned on the encapsulation layer ENC. The first insulation layer TIL0, the first conductive layer TL1, the first touch insulation layer TILL the second conductive layer TL2, and the second touch insulation layer TIL2 may form the touch sensor TS described with reference to FIG. 3.

The first insulation layer TIL0 may be disposed on the second encapsulation inorganic layer EIL2 of the encapsulation layer ENC to planarize a surface on which the first conductive layer TL1 and the like are disposed. The first conductive layer TL1 may be disposed (e.g., directly disposed) on the first insulation layer TIL0. The first insulation layer TIL0 may include at least one inorganic insulating material of a silicon oxide ($SiO_2$), a silicon nitride ($SiN_x$), and a silicon oxynitride ($SiO_xN_y$). However, the disclosure is not limited thereto. In some embodiments, the first insulation layer TIL0 may include an organic insulating material.

In some embodiments, according to an embodiment, the conductive layer TL1 may be disposed (e.g., disposed directly) on the encapsulation layer ENC. Depending on embodiments, the first insulation layer TIL0 may be omitted. The first conductive layer TL1 may be disposed (e.g., disposed directly) on the second encapsulation inorganic layer EIL2 of the encapsulation layer ENC. However, the disclosure is not limited thereto.

In an embodiment, the first touch insulation layer TIL1 may be disposed on the first conductive layer TL1. The first touch insulation layer TIL1 may be formed of an inorganic or an organic material. In case that the first touch insulation layer TIL1 is formed of the inorganic material, the first touch insulation layer TIL1 may include at least one selected from the group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxide nitride. In case that the first touch insulation layer TIL1 is formed of an organic material, the first touch insulation layer TIL1 may include at least one selected from a group consisting of an acryl-based resin, a methacrylic resin, polyisoprene, a vinyl-based resin, an epoxy-based resin, a urethane-based resin, a cellulose-based resin, and a perylene-based resin.

In an embodiment, the second conductive layer TL2 may be disposed on the first touch insulation layer TILL The second conductive layer TL2 may serve as a sensor that detects the user's touch input (or touch event). The first conductive layer TL1 may serve as a connector electrically connecting the patterned second conductive layer TL2 in a direction. In an embodiment, both the first conductive layer TL1 and the second conductive layer TL2 may serve as sensors. The first conductive layer TL1 and the second conductive layer TL2 may be electrically connected to each other through a contact hole. As described above, as both the first conductive layer TL1 and the second conductive layer TL2 may serve as sensors, the resistance of the touch electrode is reduced and thus the user's touch input can be quickly sensed.

In an embodiment, the first conductive layer TL1 and the second conductive layer TL2 may have a mesh structure such that light emitted from the emitting diode ED may pass therethrough. The first conductive layer TL1 and the second conductive layer TL2 may not overlap the emission layer EML.

The first conductive layer TL1 and the second conductive layer TL2 may include a metal layer or a transparent conductive layer. The metal layer of the first conductive layer TL1 and the second conductive layer TL2 may include at least one of molybdenum (Mo), silver (Ag), titanium (Ti), copper (Cu), and aluminum (Al). The metal layer of the first conductive layer TL1 and the second conductive layer TL2 may include alloys of the above-described metals. The transparent conductive layer of the first conductive layer TL1 and the second conductive layer TL2 may include a transparent conductive oxide such as an indium tin oxide (ITO), an indium zinc oxide (IZO), a zinc oxide (ZnO), and an indium tin zinc oxide (ITZO). The transparent conductive layer of the first conductive layer TL1 and the second conductive layer TL2 may include a conductive polymer such as PEDOT, a metal nanowire, carbon nanotubes, and graphene.

In an embodiment, the second touch insulation layer TIL2 may be disposed on the second conductive layer TL2. The second touch insulation layer TIL2 may include inorganic or organic materials. In case that the second touch insulation layer TIL2 includes an inorganic material, the second touch insulation layer TIL2 may include at least one selected from a group consisting of (or a group including) a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In case that the second touch insulation layer TIL2 includes an organic material, the second touch insulation layer TIL2 may include at least one selected from a group consisting of an acryl-based resin, a methacrylic resin, polyisoprene, a vinyl-based resin, an epoxy-based resin, a urethane-based resin, a cellulosic resin, and a perylene-based resin.

A light blocking layer BM may be positioned on the second touch insulation layer TIL2. The light blocking layer BM may include a 2-1 opening OP2-1 overlapping the emission layer EML in a plan view. The light blocking layer BM may overlap at least a part of the partition wall PDL in a plan view.

The 2-1 opening OP2-1 may overlap the 1-1 opening OP1-1 of the partition wall PDL in a plan view. The 2-1 opening OP2-1 may be larger than the 1-1 opening OP1-1 in a plan view, and the 2-1 opening OP2-1 may have a shape surrounding the 1-1 opening OP1-1. The 2-1 opening OP2-1 may have a planar shape that is similar to that of the 1-1 opening OP1-1. The 2-1 opening OP2-1 may have a circular shape in a plan view, but is not limited thereto, and may have any shape, such as a rhombus or octagonal shape similar to a rhombus or as a rhombus, a quadrangle, a polygon, an oval, and the like in a plan view.

The reflection adjustment layer OL1 may be disposed on the light blocking layer BM. The reflection adjustment layer OL1 may selectively absorb light of a wavelength of some band among light reflected from inside the display device or light incident into the display device from the outside. The reflection adjustment layer OL1 may fill the 2-1 opening OP2-1.

For example, the reflection adjustment layer OL1 may absorb a first wavelength region in a range of about 490 nm to about 505 nm and a second wavelength region in a range of about 585 nm to about 600 nm, and thus light transmittance in the first wavelength region and the second wavelength region may be about 40% or less. The reflection adjustment layer OL1 may absorb light with a wavelength outside the red, green, or blue light emitting wavelength range emitted from the emitting diode ED. Thus, the reflection adjustment layer OL1 may absorb light of a wavelength that does not belong to the wavelength range of red, green, or blue emitted from the light emitting element. Thus, the decrease in the luminance of the display device may be prevented (or minimized) and the deterioration of the luminous efficiency of the display device may be simultaneously prevented or minimized. Therefore, visibility of the display device may be improved.

In an embodiment, the reflection adjustment layer OL1 may be provided as an organic layer (or organic material layer) including a dye, a pigment, or a combination thereof. The reflection adjustment layer OL1 may include at least one of a acryl-based compound, a tetra aza porphyrin (TAP)-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diammonium-based compound, a dipyrromethene-based compound, and a cyanine-based compound. In some embodiments, the reflection adjustment layer OL1 may include a combination of the above-described materials.

For example, the reflection adjustment layer OL1 may include a compound represented by any one of Chemical Formulas 1 to 4 below. Chemical Formulas 1 to 4 may have a chromophore group structure corresponding to some of the compounds described above. Chemical Formulas 1 to 4 are only examples, and the disclosure is not limited thereto.

<Chemical Formula 1>

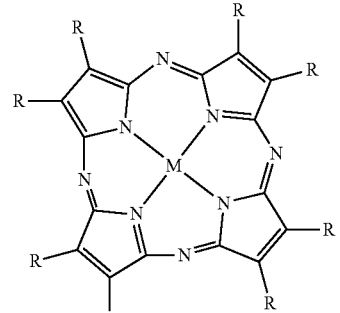

<Chemical Formula 2>

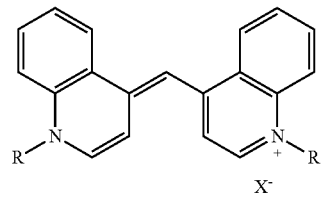

<Chemical Formula 3>

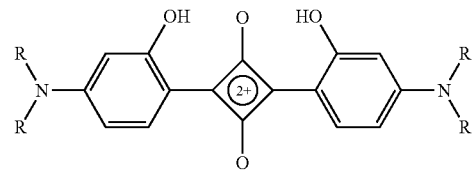

<Chemical Formula 4>

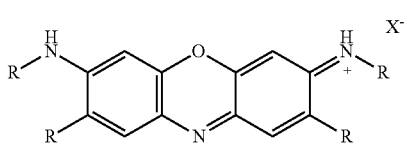

In Chemical Formulas 1 to 4,
M denotes a metal,
$X^-$ denotes a monovalent negative ion, each R may be equivalent to or different from each other, and may respectively be hydrogen, a heavy hydrogen (—D), —F, —Cl, —Br, or —I, a hydroxyl group, a cyano group, or a nitro group; a heavy hydrogen, —F, —Cl, —Br, —I, a hydroxyl group, a cyano group, a nitro group, a $C_3$ to $C_{60}$ carbocyclic group, a $C_1$ to $C_{60}$ heterocyclic group, a $C_6$ to $C_{60}$ aryloxy group, a $C_6$ to $C_{60}$ arylthio group, —Si $Q_{11}$, $Q_{12}$, and $Q_{13}$, —N $Q_{11}$, and $Q_{12}$, —B $Q_{11}$, and $Q_{12}$, —C(=O) $Q_{11}$, (=O)$_2$ $Q_{11}$, —P(=O) $Q_{11}$, and $Q_{12}$, or a $C_1$ to $C_{60}$ alkyl group, a $C_2$ to $C_{60}$ alkenyl group, a $C_2$ to $C_{60}$ alkynyl group, or a $C_1$ to $C_{60}$ alkoxy group, which may be substituted or unsubstituted with any combination thereof; a heavy hydrogen, —F, —Cl, —Br, —I, a hydroxyl group, a cyano group, or a nitro group, an alkyl group, a $C_2$ to $C_{60}$ alkenyl group, a $C_2$ to $C_{60}$ alkynyl group, a $C_1$ to $C_{60}$ alkoxy group, a $C_3$ $C_{60}$ carbocyclic group, or a $C_3$-$C_{60}$ carbocyclic group, a $C_1$ to $C_{60}$ heterocyclic group, a $C_6$ to $C_{60}$ aryloxy group, or a $C_6$ to $C_{60}$ arylthio group, which may be unsubstituted or substituted with any combination thereof; or —Si $Q_{31}$, $Q_{32}$, and $Q_{33}$, —N $Q_{31}$, and $Q_{32}$, —B $Q_{31}$, and $Q_{32}$, —C(=O) $Q_{31}$, —S(=O)$_2$ $Q_{31}$, or —P(=O) $Q_{31}$, and $Q_{32}$.

$Q_1$ to $Q_3$, $Q_{11}$ to $Q_{13}$, $Q_{21}$ to $Q_{23}$, and $Q_{31}$ to $Q_{33}$ may independently be hydrogen; heavy hydrogen; —F; —Cl; —Br; —I; a hydroxyl group; a cyano group; a nitro group; a $C_1$ to $C_{60}$ alkyl group; a $C_2$ to $C_{60}$ alkenyl group; a $C_2$ to $C_{60}$ alkynyl group; a $C_1$ to $C_{60}$ alkoxy group; or heavy hydrogen, —F, a cyano group, a $C_1$ to $C_{60}$ alkyl group, a $C_1$ to $C_{60}$ alkoxy group, a phenyl group, a biphenyl group, or a $C_3$ to $C_{60}$ carbocyclic group or a $C_1$ to $C_{60}$ heterocyclic group, which may be unsubstituted or substituted with any combination thereof.

In an embodiment, X— may be a halide ion, a carbohydrate ion, a nitrate ion, a sulfonate ion, or a bisulfate ion. For example, X— may be F—, Cl—, Br—, I—, $CH_3COO^-$, $NO_3^-$, $HSO_4^-$, a propionate ion, a benzene sulfonate ion, and the like.

In an embodiment, a reflectance measured in a specular component included (SCI) mode on a surface of the reflection adjustment layer OL1 may be about 10% or less. For example, the reflection adjustment layer OL1 may absorb external light reflection of the display device. Thus, visibility of the display device may be improved.

The display device according to the embodiment may include a low reflection layer AL2 and a reflection adjustment layer OL1 without using a polarization film to reduce the external light reflection.

In an embodiment, the reflection adjustment layer OL1 may have transmittance of about 64% to about 72%. The transmittance of the reflection adjustment layer OL1 may be adjusted according to the content of pigment and/or dye included in the reflection adjustment layer OL1.

A second capping layer OL2 may be positioned on the reflection adjustment layer OL1. The second capping layer OL2 according to the embodiment may overlap the entire surface of the substrate SUB in a plan view. The second capping layer OL2 may have a substantially equivalent thickness across the entire surface of the substrate SUB. The second capping layer OL2 may be positioned between the reflection adjustment layer OL1 and an overcoat layer OL3, and may prevent the dye, pigment, or a combination thereof included in the reflection adjustment layer OL1 from moving to the overcoat layer OL3. In case that the dye, pigment, or a combination thereof included in the reflection adjustment layer OL1 moves to the overcoat layer OL3, display quality of the display device may be deteriorated. The display device according to the embodiment may include the second capping layer OL2 to maintain the quality of the display panel and improve the display quality provided by the display device.

The second capping layer OL2 may include an inorganic material. For example, the inorganic material of the second capping layer OL2 may include at least one of a silicon nitride, a silicon oxide, and a silicon oxynitride. However, the disclosure is not limited thereto.

The overcoat layer OL3 may be positioned over the second capping layer OL2. The overcoat layer OL3 may be made of organic or inorganic materials. The overcoat layer OL3 may completely cover the second capping layer OL2, and overlap the entire surface of the substrate SUB in a plan view. The overcoat layer OL3 may protect the reflection adjustment layer OL1, which is positioned below the overcoat layer OL3. The upper surface of the overcoat layer OL3 may be formed to be flat.

Referring to FIG. 8, a stacked structure of a first component area EA1 is described. For a description of a planar and cross-sectional structure for the display area DA is the same as that described with reference to FIG. 7, so it will be omitted below. Hereinafter, the first component area EA1 will be described.

The first component area EA1 may be formed of a transparent layer, and light may pass therethrough. A conductive layer or a semiconductor layer may not be positioned on the first component area EA1. Since a partition wall, a light blocking layer BM including a light blocking material includes an opening that overlaps a position corresponding to the first component area EA1 in a plan view, light may not be blocked by the opening.

The first component area EA1 may include a buffer layer BF, a gate insulation layer GI, a first insulation layer ILL and a second insulation layer IL2, which are disposed on the substrate SUB. Depending on embodiments, at least one of the buffer layer BF, the gate insulation layer GI, the first insulation layer ILL and the second insulation layer IL2 may be omitted.

The partition wall PDL according to the embodiment may include a 1-2 opening OP1-2 overlapping the first component area EA1 in a plan view. The partition wall PDL may include the light blocking material, and may be spaced apart from the first component area EA1 without overlapping.

The first component area EA1 may include a first function layer FL1, a second function layer FL2, a second electrode E2, a first capping layer AL1, and a low-reflective layer AL2, and an encapsulation layer ENC. The first function layer FL1, the second function layer FL2, the second electrode E2, the first capping layer AL1, and the low-reflective layer AL2 may be disposed on the second insulation layer IL2.

A first insulation layer TIL0, a first touch insulation layer TILL and a second touch insulation layer TIL2 may be positioned on the encapsulation layer ENC. The first conductive layer TL1 and the second conductive layer TL2 included in a touch sensor may not overlap the first component area EA1.

A 2-2 opening OP2-2 included in the light blocking layer BM may be positioned on the second touch insulation layer TIL2. The first component area EA1 may overlap the 2-2 opening OP2-2 of the light blocking layer BM in a plan view. The first component area EA1 may not overlap the light blocking layer BM that blocks light.

The first component area EA1 may overlap a 3-1 opening OP3-1 of the reflection adjustment layer OL1 in a plan view. The reflection adjustment layer OL1 may include the 3-1 opening OP3-1 overlapping the first component area EA1.

The 3-1 opening OP3-1 may have a shape that is similar (e.g., almost similar) to that of first component area EA1. The reflection adjustment layer OL1 may have a shape removed from the first component area EA1. For example, the reflection adjustment layer OL1 may be partially removed from the first component area EA1 to form the 3-1 opening OP3-1.

The reflection adjustment layer OL1 may cover a side surface of the light blocking layer BM, and the opening may be formed by the side surface of the light blocking layer BM, but the disclosure is not limited thereto, and various forms in which the reflection adjustment layer OL1 and the side surfaces of the light blocking layer BM may be aligned to form a single surface. In some embodiments, the reflection adjustment layer OL1 may be formed on the upper surface of the light blocking layer BM.

According to the embodiment, since the light blocking layer BM and reflection adjustment layer OL1 are removed in the first component area EA1, transmittance may be excellent.

The second capping layer OL2 and the overcoat layer OL3 extending from the display area DA may be positioned on the reflection adjustment layer OL1. The second capping layer OL2 may prevent the dye, pigment, or a combination thereof included in the reflection adjustment layer OL1 from moving to the overcoat layer OL3.

The second capping layer OL2 may have a shape covering the 3-1 opening OP3-1 of the reflection adjustment layer OL1. The second capping layer OL2 may overlap the entire surface of the substrate SUB in the first component area EA1 in a plan view. In the first component area EA1 and the display area DA, the second capping layer OL2 may form a step (or height difference or thickness difference). The second capping layer OL2 may be formed with a substantially uniform thickness over the first component area EA1 and the display area DA.

The overcoat layer OL3 extending from the display area DA may be positioned on the second capping layer OL2. The overcoat layer OL3 may have a shape to fill the step of the second capping layer OL2. The overcoat layer OL3 may provide a flat top surface over the first component area EA1 and the display area DA. The overcoat layer OL3 may fill the 3-1 opening OP3-1 with the reflection adjustment layer OL1.

Referring to FIG. 9, a stacked structure of a second component area EA2 is described below. A description of elements that are the same as the above-described elements will be omitted.

The second component area EA2 may include a display portion LDA and a transmissive portion LTA on which pixels are disposed. Since a description of a region where an emitting diode ED is positioned among planar and cross-section structures of the display portion LDA of FIG. 9 is the same as that described with reference to FIG. 7, it will be omitted below.

Description of the transmissive portion LTA is provided below. The second component area EA2 may include the transmissive portion LTA, and the transmissive portion LTA may have relatively high light transmittance compared to the display portion LDA. The second component area EA2 may be a region positioned on a front surface of the above-described second optical element ES2 (e.g., refer to FIG. 2). The second component area EA2 may include the display portion LDA including the pixels and the transmissive portion LTA that is disposed between adjacent display portions LDA. For example, the transmissive portion LTA may be additionally formed in the second component area EA2. The display portion LDA may be formed to have a structure by adding multiple pixels, and the transmissive portion LTA may be positioned between adjacent structures. For example, the multiple pixels may be grouped to form the structure in the display portion LDA, and the transmissive portion LTA may be positioned between the adjacent structures.

The transmissive portion LTA may be formed of only a transparent layer, and light may pass therethrough. A conductive layer or a semiconductor layer may not be positioned in the transmissive portion LTA, and a partition wall PDL containing a light blocking material, a light blocking layer BM, and the like may include an opening that overlaps the position corresponding to the transmissive portion LTA in a plan view. Thus, the light may not be blocked in the transmissive portion LTA.

The transmissive portion LTA may include a buffer layer BF and a gate insulation layer GI that are disposed on the substrate SUB. In the specification, the first insulation layer ILL the second insulation layer IL2, the partition wall PDL, and the spacer SPC may not be positioned in the transmissive portion LTA. In some embodiments, all or a part of the first insulation layer ILL the second insulation layer IL2, the partition wall PDL, and the spacer SPC may include a transparent layer, and may be positioned in the transmissive portion LTA. In some embodiments, all or a part of the buffer layer BF and the gate insulation layer GI may be removed from the transmissive portion LTA.

The partition wall PDL according to the embodiment may include a 1-3 opening OP1-3 overlapping the transmissive portion LTA in a plan view. The partition wall PDL may have a shape that is removed from the transmissive portion LTA. For example, a portion of the partition wall PDL in the transmissive portion LTA may be removed to form the 1-3 opening OP1-3. The partition wall PDL including a light blocking material that may be spaced apart from the transmissive portion LTA without overlapping the transmissive portion LTA in a plan view.

The first function layer FL1 and the second function layer FL2 may extend from the display portion LDA, and be positioned in the transmissive portion LTA.

In the transmissive portion LTA, an end of the second electrode E2 extending from the display portion LDA may be disposed on the second function layer FL2. The second electrode E2 may not be positioned in most regions of the transmissive portion LTA. However, the disclosure is not limited thereto, and the second electrode E2 may be removed, and not overlap (e.g., completely overlap) the transmissive portion LTA.

A low adhesive layer WAL may be positioned in the transmissive portion LTA. The low adhesive layer WAL may be positioned on the second function layer FL2 in the transmissive portion LTA. The low adhesive layer WAL may include a material with weak adherence, and thus the second electrode E2 may not be disposed on an upper surface of the low adhesive layer WAL as shown in FIG. 9. In some embodiments, the second electrode E2 may be formed into a very thin film.

For example, the low adhesive layer WAL may be formed by using a material such as Liq [8-Quinolinolato Lithium]), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), 2-(4-(9,10-di(naphthalene-2-yl)anthracene-2-yl)phenyl)-1-phenyl-1H-benzo-[D]imidazole (LG201), and the like.

The low adhesive layer WAL may be positioned in the transmissive portion LTA. In another embodiment, the low adhesive layer WAL may not be positioned (or omitted), and at least a part of the second electrode E2 may be removed through a laser process or the like. The laser process may be performed on the second electrode E2.

In the transmissive portion LTA, a first capping layer AL1, a low-reflective layer AL2, and an encapsulation layer ENC may be disposed on the low adhesive layer WAL. For example, an organic encapsulation layer EOL may have a shape that fills the 1-3 openings OP1-3, and the organic encapsulation layer EOL may provide a flat top surface.

The first insulation layer TIL0, the first touch insulation layer TILL and the second touch insulation layer TIL2 may be positioned on the encapsulation layer ENC. The first conductive layer TL1 and the second conductive layer TL2 included in a touch sensor may not overlap the transmissive portion LTA.

A 2-3 opening OP2-3 included in the light blocking layer BM may be positioned on the second touch insulation layer TIL2. The transmissive portion LTA may overlap the 2-3 opening OP2-3 of the light blocking layer BM in a plan view. The light blocking layer BM may have a form that is removed from the transmissive portion LTA. For example, the light blocking layer BM may be removed in the transmissive portion LTA to form the 2-3 opening OP2-3. For example, the transmissive portion LTA may not overlap the light blocking layer BM that blocks light.

The transmissive portion LTA may overlap a 3-2 opening OP3-2 of a reflection adjustment layer OL1 in a plan view. The reflection adjustment layer OL1 may have a shape that is removed from the transmissive portion LTA. For example, the reflection adjustment layer OL1 may be removed in the transmissive portion LTA to form the 3-2 opening OP3-2. The reflection adjustment layer OL1 having a substantial thickness may be spaced apart from the transmissive portion LTA.

In the embodiment according to the specification, the opening (e.g., 3-2 opening OP3-2) may be formed through the reflection adjustment layer OL1, and the reflection adjustment layer OL1 may cover side surfaces of the light blocking layer BM, but this is not restrictive, and various shapes may be possible. In an embodiment, a side surface the reflection adjustment layer OL1 and a side surface of the light blocking layer BM may be aligned to form a single surface. In some embodiments, the reflection adjustment layer OL1 may be only formed on an upper surface of the light blocking layer BM.

The second component area EA2 according to the embodiment may include the display portion LDA and the transmissive portion LTA that are alternately disposed. For example, multiple display portions LDA and multiple transmissive portions LTA may be alternately disposed in the second component area EA2. According to the embodiment, since the light blocking layer BM and the reflection adjustment layer OL1 may be removed in the transmissive portion LTA, transmittance in the transmissive portion LTA may be excellent.

The second capping layer OL2 and the overcoat layer OL3 extending from the display portion LDA may be positioned on the reflection adjustment layer OL1. The second capping layer OL2 may block migration of a dye, a pigment, or a combination thereof included in the reflection adjustment layer OL1 to the overcoat layer OL3.

The second capping layer OL2 may have a shape covering the 3-2 opening OP3-2 of the reflection adjustment layer OL1. The second capping layer OL2 may overlap the entire surface of the substrate SUB in the second component area EA2 in a plan view. In the transmissive portion LTA and the display portion LDA, the second capping layer OL2 may form a step. The second capping layer OL2 may be formed to have a substantially uniform thickness over the transmissive portion LTA and the display portion LDA. The second capping layer OL2 may be formed to have a thickness that is substantially equivalent to that over the second component area EA2.

The overcoat layer OL3 extending from the display portion LDA may be positioned on the second capping layer OL2. The overcoat layer OL3 may have a shape to fill the step of the second capping layer OL2. The overcoat layer OL3 may provide a flat top surface over the transmissive portion LTA and the display portion LDA. The overcoat layer OL3 may fill the 3-2 opening OP3-2 with the reflection adjustment layer OL1.

Figure 10:
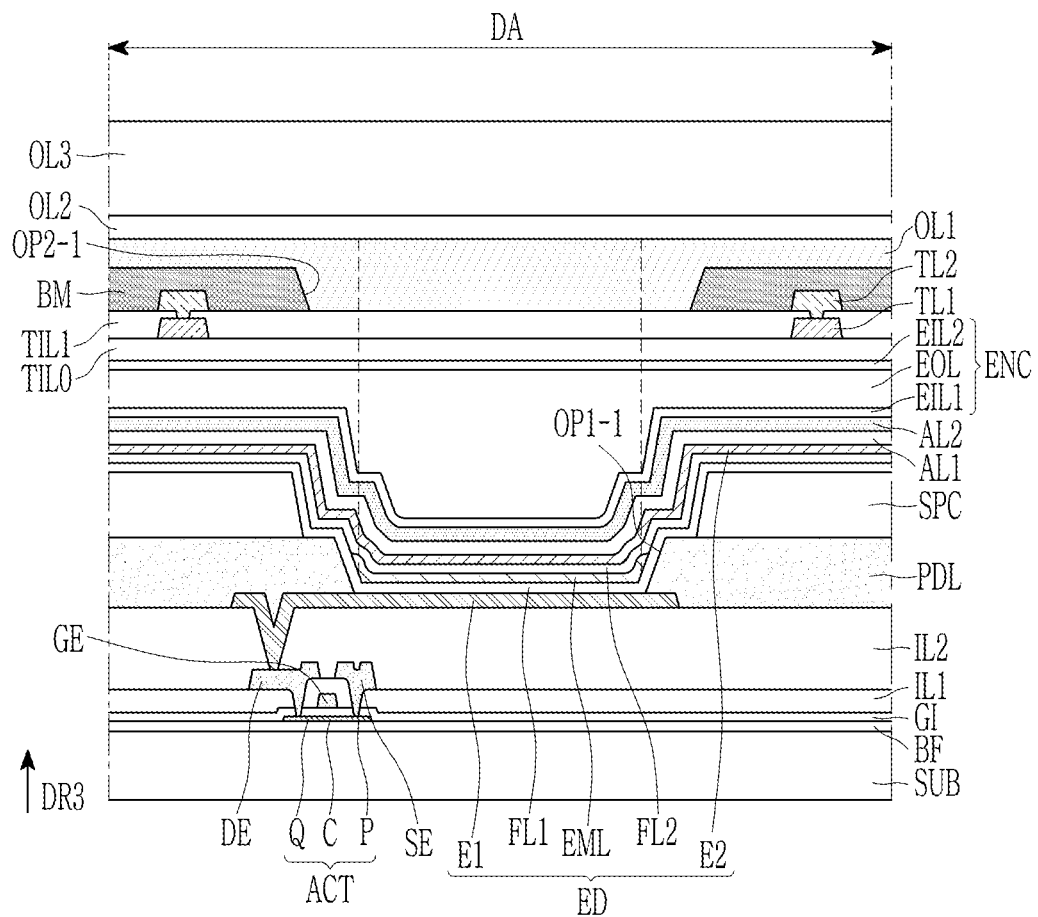
FIG. 10 is a schematic cross-sectional view of elements disposed in a display area according to an embodiment.
Figure 11:
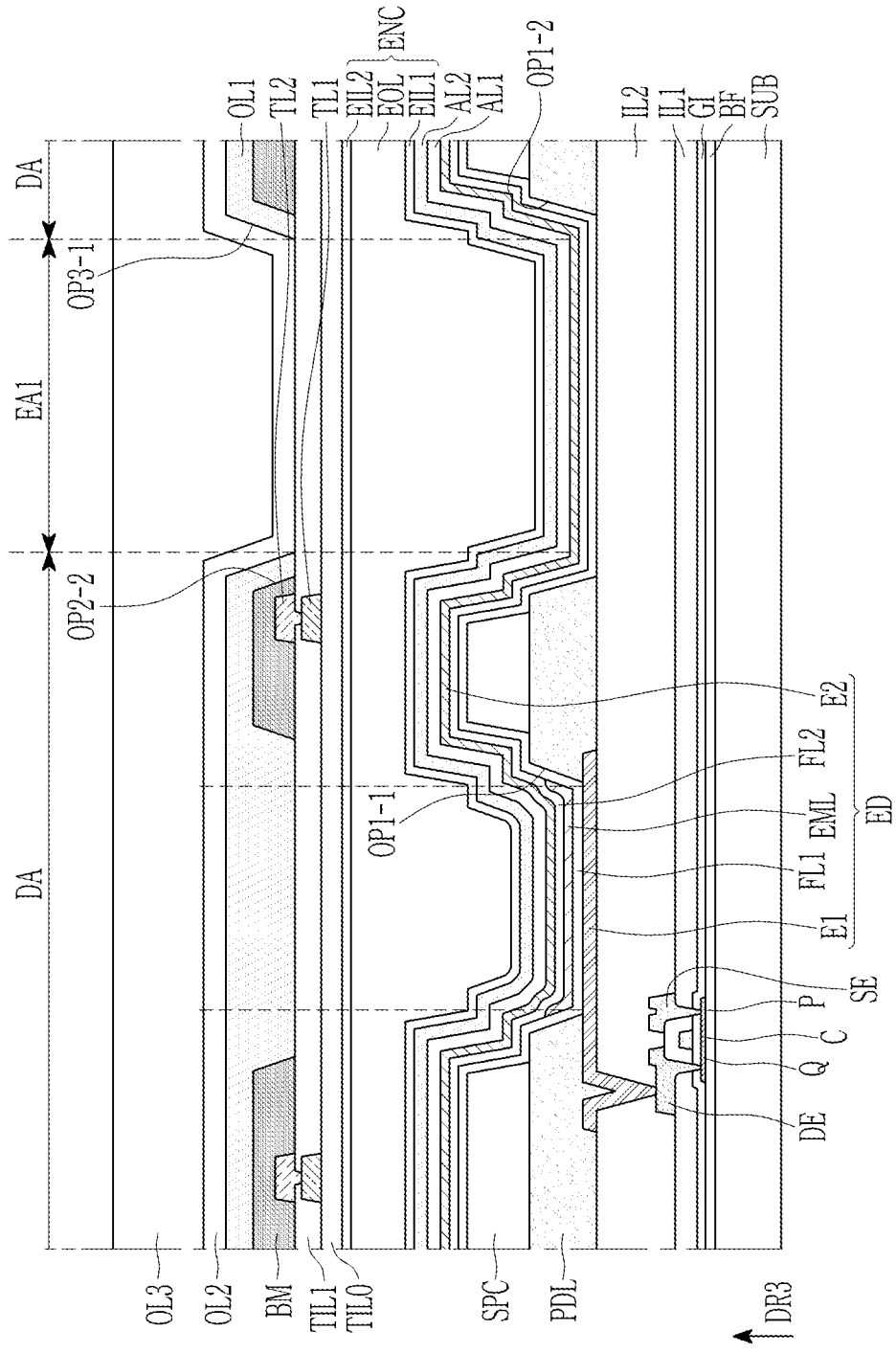
FIG. 11 is a schematic cross-sectional view of elements disposed in the display area and a first component area according to the embodiment.
Figure 12:
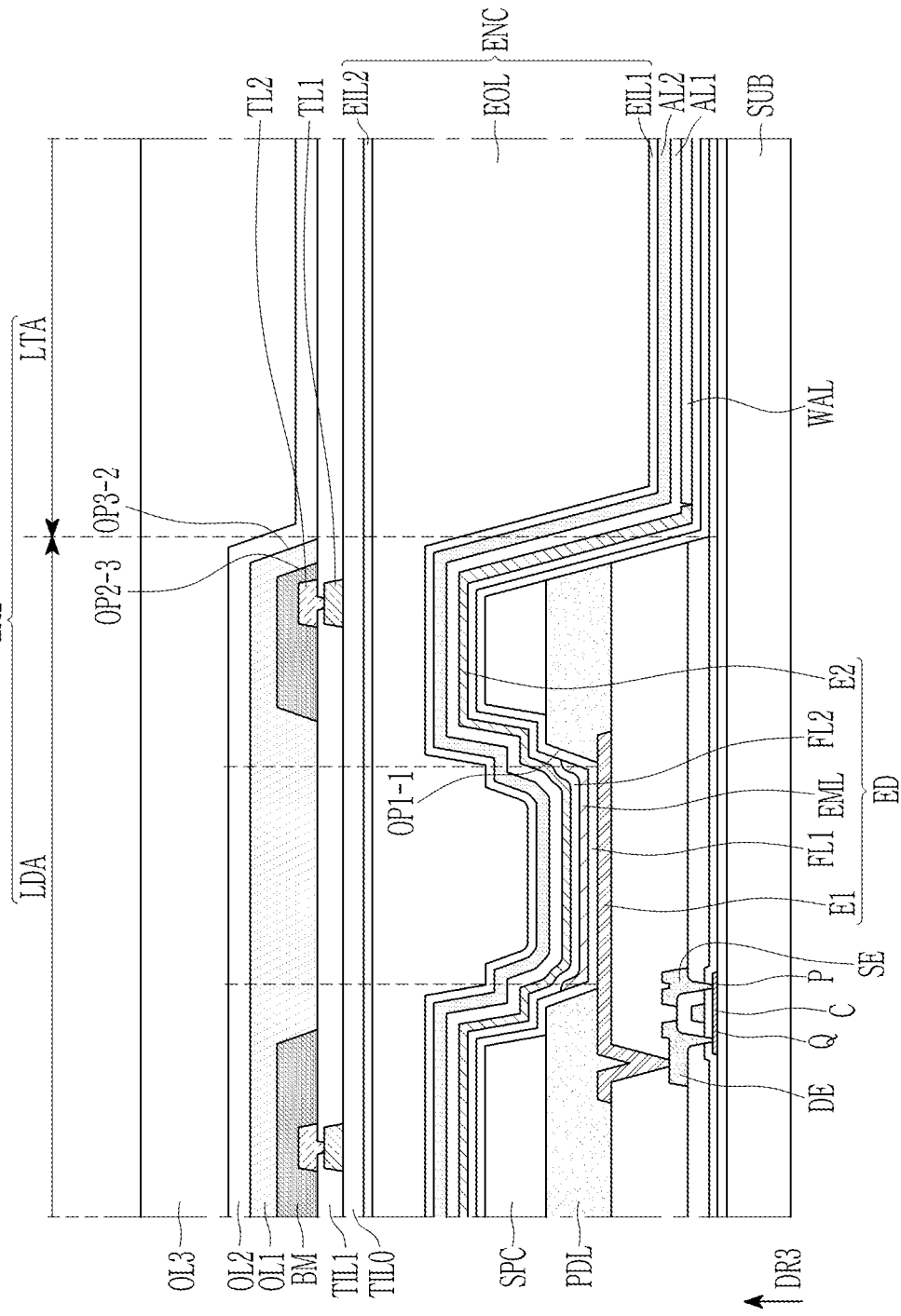
FIG. 12 is a schematic cross-sectional view of elements disposed in a second component area according to the embodiment.

Description of a display panel according to an embodiment is provided below with reference to FIGS. 10 to 12. FIG. 10 is a schematic cross-sectional view of elements disposed in a display area according to an embodiment. FIG. 11 is a schematic cross-sectional view of elements disposed in the display area and a first component area according to the embodiment. FIG. 12 is a schematic cross-sectional view of elements disposed in a second component area according to the embodiment. A description of the same elements as the above-described elements will be omitted.

Referring to FIGS. 10 and 12, a light blocking member BM according to an embodiment may be positioned above (e.g., right above) a second conductive layer TL2 in a display portion LDA of a second component area EA2. In the display area DA and the display portion LDA of the second component area EA2, the light blocking member BM may cover the second conductive layer TL2. A part of the light blocking member BM may be positioned above (e.g., directly above) a first touch insulation layer TIL1 in the display area DA and the display portion LDA of the second component area EA2.

Referring to FIG. 11, a second capping layer OL2 may contact a first touch insulation layer TIL1 in the first component area EA1. The reflection adjustment layer OL1 may expose the first touch insulation layer TIL1 in the first component area EA1, and the second capping layer OL2 may be positioned on the exposed first touch insulation layer TIL1.

Referring to FIG. 12, the second capping layer OL2 may contact the first touch insulation layer TIL1 in the transmissive portion LTA of the second component area EA2. The reflection adjustment layer OL1 may expose the first touch insulation layer TIL1 in the transmissive portion LTA of the second component area EA2, and the second capping layer OL2 may be positioned on the exposed first touch insulation layer TIL1.

Compared to the embodiment of FIGS. 7 to 9, the second touch insulation layer TIL2 may be omitted in the embodiment of FIGS. 10 to 12. A manufacturing process of the display device may be simplified, such that the time and cost required for the manufacturing process may be reduced.

Figure 13:
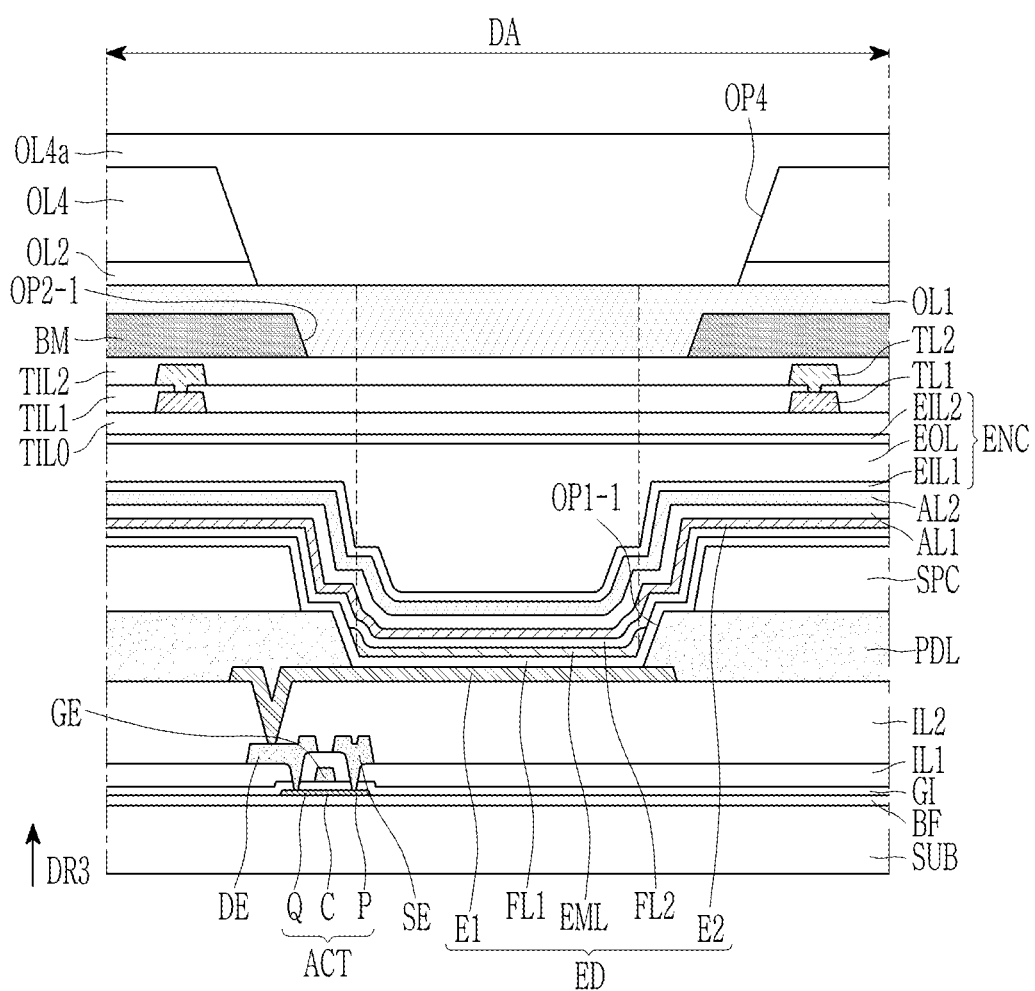
FIG. 13 is a schematic cross-sectional view of elements disposed in a display area according to an embodiment.
Figure 14:
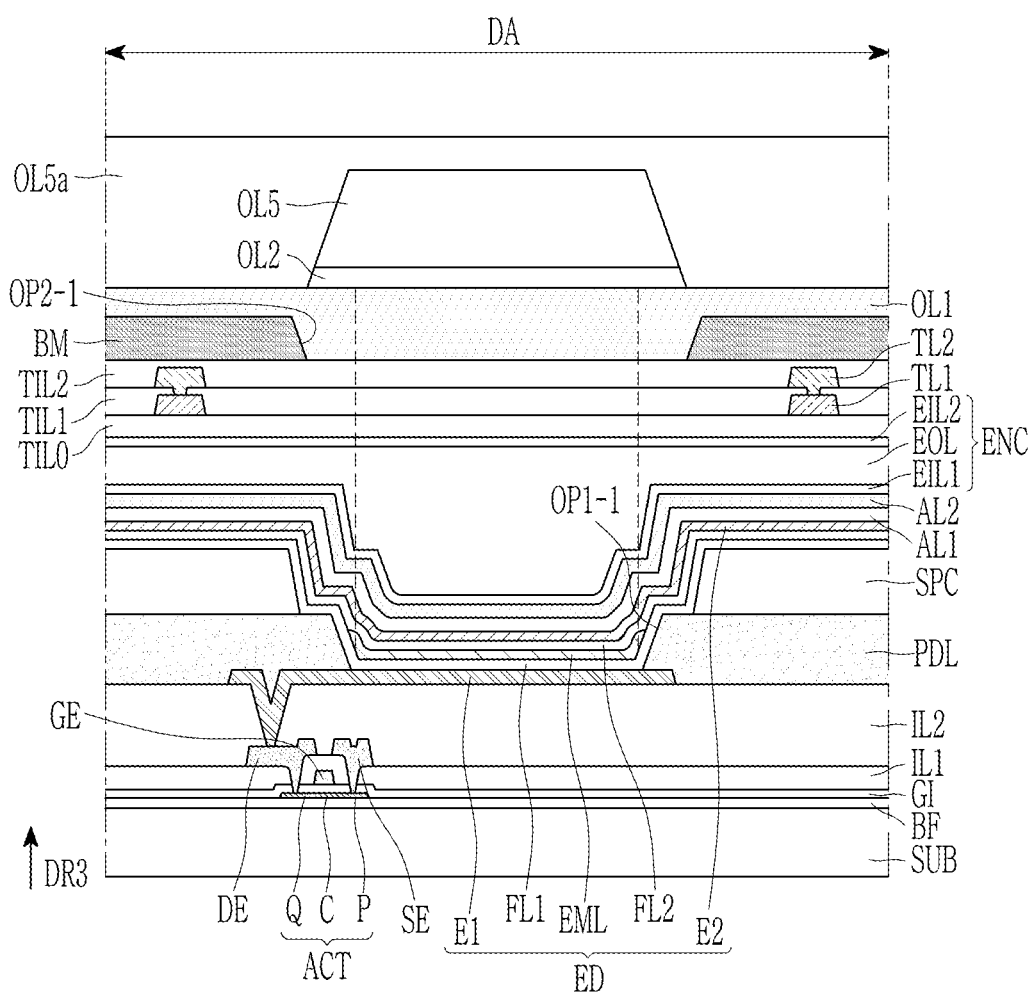
FIG. 14 is a schematic cross-sectional view of elements disposed in a display area according to an embodiment.

Referring to FIGS. 13 and 14, description of a display panel according to an embodiment is provided below. FIG. 13 is a schematic cross-sectional view of elements disposed in a display area according to an embodiment, and FIG. 14 is a schematic cross-sectional view of elements disposed in a display area according to an embodiment. A description of the above-described elements and the same description of and the same elements as the above-described elements will be omitted.

Referring to FIG. 13, a second capping layer OL2 positioned on a reflection adjustment layer OL1 may be positioned in a display area DA. The second capping layer OL2 may be positioned between the reflection adjustment layer OL1 and an overcoat layer OL4. The second capping layer OL2 may prevent inflow of a dye, a pigment, or a combination thereof from the reflection adjustment layer OL1 to the overcoat layer OL4.

The overcoat layer OL4 may be positioned on the second capping layer OL2. The overcoat layer OL4 may overlap at least a portion of a light blocking layer BM and may overlap at least a portion of a partition wall PDL in a plan view.

The second capping layer OL2 and the overcoat layer OL4 may include a fourth opening OP4 overlapping a 2-1 opening OP2-1 in a plan view. The fourth opening OP4 may be larger than the 2-1 opening OP2-1, but is not limited thereto, and may be substantially equivalent to or smaller than the 2-1 opening OP2-1. The fourth opening OP4 may overlap an emitting diode ED (e.g., emission layer EML) in a plan view.

The overcoat layer OL4 according to the embodiment may include a light transmissive organic material having a low refractive index. For example, the overcoat layer OL4 may include at least one of an acrylic resin, a polyimide resin, a polyamide resin, and Alq3 [tris(8-hydroxyquinolinato)aluminum].

The display device according to the embodiment may further include an organic layer OL4a positioned on the overcoat layer OL4.

The organic layer OL4a may be formed of an organic insulating material. A refractive index of the organic layer OL4a may be adjusted according to a functional group included therein (e.g., in organic layer OL4a). In some embodiments, the refractive index of the organic layer OL4a may be adjusted according to the type and content of nanoparticles included in the organic layer OL4a.

The organic layer OL4a may include any material having a higher refractive index than the overcoat layer OL4, and may include at least one of an acryl-based resin, a siloxane resin, and a polyimide resin.

At least a part of light generated by the emitting diode ED may be reflected (e.g., totally reflected) at an interface between the overcoat layer OL4 and the organic layer OL4a. Thus, the light may be condensed to a front of the display device. For example, luminance in front of the display device may be improved by the total reflection of the light at the interface between the overcoat layer OL4 and the organic layer OL4a. For example, light emitted from the emission layer EML may be emitted in various directions, and at least a part of the light incident on the overcoat layer OL4 may be reflected at the interface between the overcoat layer OL4 and the organic layer OL4a. The total reflection may occur at the interface between the overcoat layer OL4 and the organic layer OL4a in case that light incident on the organic layer OL4a having a relatively large refractive index travels to the overcoat layer OL4 having a relatively small refractive index.

Referring to FIG. 14, a second capping layer OL2 and an overcoat layer OL5 disposed on a reflection adjustment layer OL1 may be positioned in a display area DA. The second capping layer OL2 may be positioned between the reflection adjustment layer OL1 and the overcoat layer OL5. The second capping layer OL2 may prevent inflow of a dye, a pigment, or a combination thereof from the reflection adjustment layer OL1 to the overcoat layer OL5.

The overcoat layer OL5 and the second capping layer OL2 may overlap a 2-1 opening OP2-1 and a 1-1 opening OP1-1 in a plan view. The overcoat layer OL5 and the second capping layer OL2 may overlap an emission layer EML in a plan view.

The overcoat layer OL5 may include a light transmissive organic material with a relatively high refractive index. The overcoat layer OL5 may be formed of an organic insulating material. The refractive index of the overcoat layer OL5 may be adjusted according to a functional group included therein (e.g., in overcoat layer OL5). In some embodiments, the refractive index of the overcoat layer OL5 may be adjusted according to the type and content of nanoparticles included in the overcoat layer OL5.

According to an embodiment, an organic layer OL5a positioned on the overcoat layer OL5 may be further included. A refractive index of the organic layer OL5a according to an embodiment may be lower than that of the overcoat layer OL5. The organic layer OL5a according to the embodiment may include at least one of an acrylic resin, a polyimide resin, a polyamide resin, and Alq3[Tris(8-hydroxyquinolinato)aluminum].

At least a portion of the light generated by the emitting diode ED may be reflected (e.g., totally reflected) at the interface between the overcoat layer OL5 and the organic layer OL5a. Thus, the light may be condensed to a front of the display device. For example, luminance in front of the display device may be improved by the total reflection of the light at the interface between the overcoat layer OL5 and the organic layer OL5a. For example, the light generated from the emission layer EML may be emitted in various directions, and at least a portion of the light incident on the overcoat layer OL5 may be reflected at the interface between the overcoat layer OL5 and the organic layer OL5a. The total reflection may occur at the interface between the overcoat layer OL5 and the organic layer OL5a in case that light incident on the overcoat layer OL5 having a relatively large refractive index travels to the organic layer OL5a having a relatively small refractive index.

Figure 15:
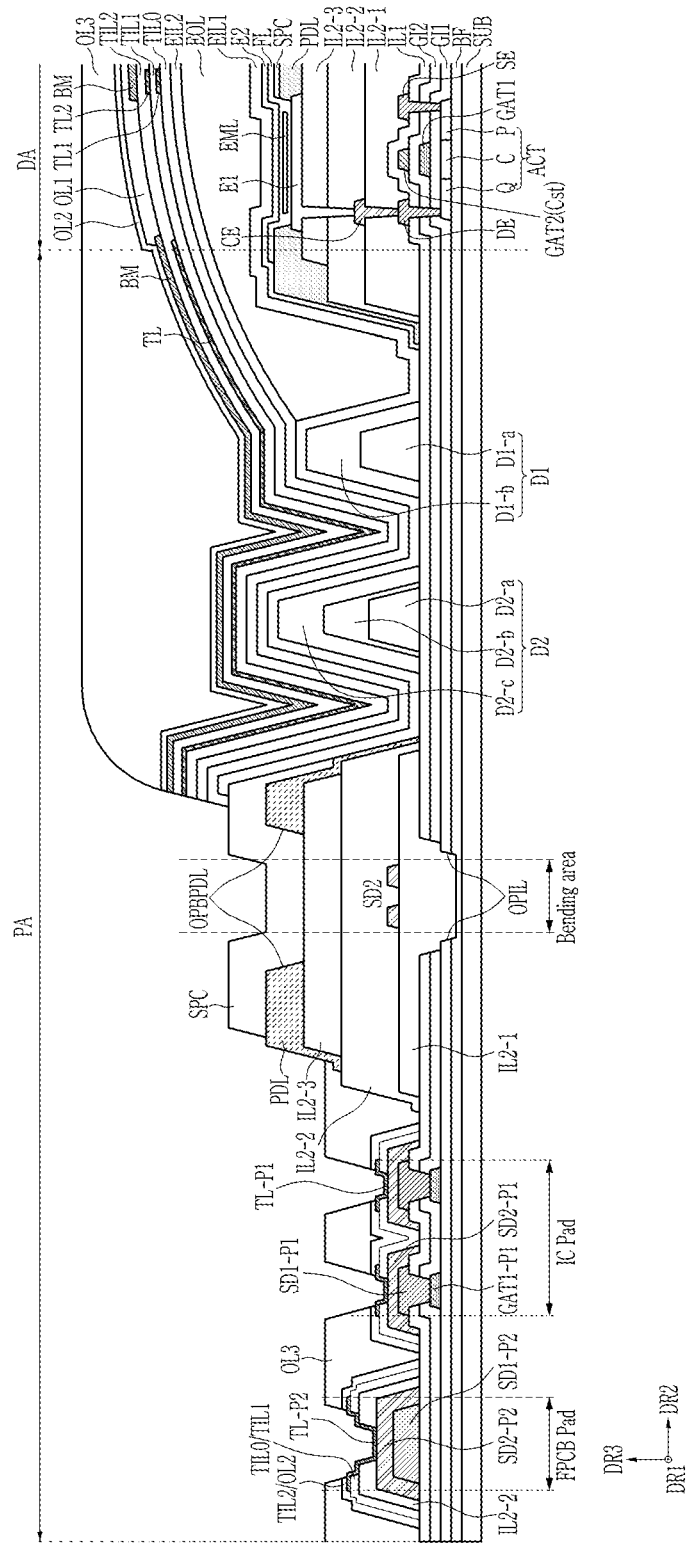
FIG. 15 is a schematic cross-sectional view taken along a first peripheral area in a peripheral area.

Description of a peripheral area of a display panel according to an embodiment is provided below with reference to FIG. 15. FIG. 15 is a schematic cross-sectional view taken along a first peripheral area in a peripheral area, and a cross-section of a second peripheral area may also refer to FIG. 15.

Referring to FIG. 15, a display area DA may have a similar stacked structure of the display area DA described with reference to FIG. 7. The structure described with reference to FIG. 7 is different from the structure described with reference to FIG. 7 at least in that a second gate insulation layer GI2 and an upper electrode GAT2 may further be positioned on a gate electrode GAT1. A drain electrode DE may be electrically connected with a first electrode E1 through a connection electrode CE. A 2-1 insulation layer IL2-1, a 2-2 insulation layer IL2-2, and a 2-3 insulation layer IL2-3 may be positioned between the drain electrode DE and the first electrode E1, and an insulation layer is not limited thereto and may be provided in various stacked structures.

Dams D1 and D2 may be positioned in the peripheral area PA. In the specification, two dams D1 and D2 are illustrated, but the number and type of the dams D1 and D2 are not limited thereto. The dams D1 and D2 may be formed on a first insulation layer IL1 extended from the display area DA.

The first dam D1 may include a 1-1 sub-dam D1-a and a 1-2 sub-dam D1-b. The second dam D2 may include a 2-1 sub-dam D2-a, a 2-2 sub-dam D2-b, and a 2-3 sub-dam D2-c. The first dam D1 and the second dam D2 may include the same material as organic layers positioned in the display area DA, and may be formed in a same process.

A first encapsulation inorganic layer EIL1 extending from the display area DA may be positioned on each of the dams D1 and D2.

The first dam D1 positioned closest to the display area DA may at least partially overlap an encapsulation organic layer EOL extending from the display area DA in a plan view. In a process of forming the encapsulation organic layer EOL, an organic material for forming the encapsulation organic layer EOL may be prevented from overflowing by the first dam D1.

A second encapsulation inorganic layer EIL2 may be positioned on the encapsulation organic layer EOL. The first encapsulation inorganic layer EIL1 may contact the second encapsulation inorganic layer EIL2 on at least the second dam D2. The first encapsulation inorganic layer EIL1 may block moisture and oxygen from the outside through a structure in contact with the second encapsulation inorganic layer EIL2. For example, the moisture and oxygen may be blocked from the outside by the structure, in which the first encapsulation inorganic layer EIL1 contacts the second encapsulation inorganic layer EIL2.

A first insulation layer TIL0, a first touch insulation layer TIL1 a second touch insulation layer TIL2, a light blocking member BM, a second capping layer OL2, and an overcoat layer OL3 may extend from the display area DA, and may be positioned on the second encapsulation inorganic layer EIL2. A signal line TL may extend from a second conductive layer TL2.

A driver pad portion IC Pad may include a first gate additional pad electrode GAT1-P1 formed in the same process as the gate electrode GAT1, a 1-1 data additional pad electrode SD1-P1 formed in the same process as the source electrode SE, and a 1-2 data additional pad electrode SD2-P1 formed in the same process as the connection electrode CE. In some embodiments, at least one of the above-described additional pad of the driver pad portion IC Pad may be omitted. The driver pad portion IC Pad may further include a first pad electrode TL-P1. The first pad electrode TL-P1 may be formed in the same process as the second conductive layer TL2, but the disclosure is not limited thereto, and may be partially modified to be formed in the same process as the first conductive layer TL1. The first insulation layer TIL0 and the first touch insulation layer TIL1 may be positioned between the first pad electrode TL-P1 and the 1-2 data additional pad electrode SD2-P1, and one of the first insulation layer TIL0 and the first touch insulation layer TIL1 may be omitted. A circuit board pad portion FPCB Pad (or FPCB pad portion) may include a 2-1 additional pad electrode SD1-P2 formed in the same process as the source electrode SE, and a 2-2 additional pad electrode SD2-P2 formed in the same process as the connection electrode CE. The circuit board pad portion FPCB Pad according to the embodiment may further include a second pad electrode TL-P2. The second pad electrode TL1-P2 may be formed in the same process as the second conductive layer TL2, but the disclosure is not limited thereto, and the second pad electrode TL1-P2 may be partially modified to be formed in the same process as the first conductive layer TL1.

The insulation layer IL2-2, the first insulation layer TIL0, and the first touch insulation layer TIL1 may be positioned between the second pad electrode TL1-P2 and the 2-1 additional pad electrode SD2-P2, and one of the insulation layer IL2-2, the first insulation layer TIL0, and the first touch insulation layer TIL1 may be omitted.

A bending area may be positioned between the second dam D2 and the driver pad portion IC pad. The inorganic layers (e.g., gate insulation layers GI1 and GI2, first insulation layer ILL or the like) may be removed corresponding to the bending area. An inorganic layer may not be included in the bending area. Multiple inorganic layers (e.g., gate insulation layers GI1 and GI2, first insulation layer ILL or the like) may be positioned adjacent to the bending area, and include openings OPIL formed corresponding to the bending area. In some embodiments, a portion of the insulation layers may not be removed, and the portion of the inorganic film may be included (or remain) in the bending area. The openings OPIL of the inorganic layers may be referred to as a first opening. An opening OPBPDL may be formed in a partition wall PDL corresponding to the bending area, and the partitional wall PDL may not be formed in the bending area. The opening OPBPDL of the partition wall PDL may be referred to as a second opening. An organic insulation layer formed through the same process as the 2-1 insulation layer IL2-1, the 2-2 insulation layer IL2-2, the 2-3 insulation layer IL2-3, the partition wall PDL, and the spacer SPC may be formed in the bending area.

The second touch insulation layer TIL2, the second capping layer OL2, and the overcoat layer OL3 may be positioned between the bending area and the driver pad portion IC Pad. The second touch insulation layer TIL2, the second capping layer OL2, and the overcoat layer OL3 may be positioned between the driver pad portion IC Pad and the bending area.

Although not illustrated in the specification, an area corresponding to the aforementioned second peripheral area PA2 (e.g., refer to FIG. 2) may be formed in the same structure including the second dam D2 and an adjacent area to the second dam D2 shown in FIG. 15. Thus, a description of the same elements will be omitted below.

Figure 16:
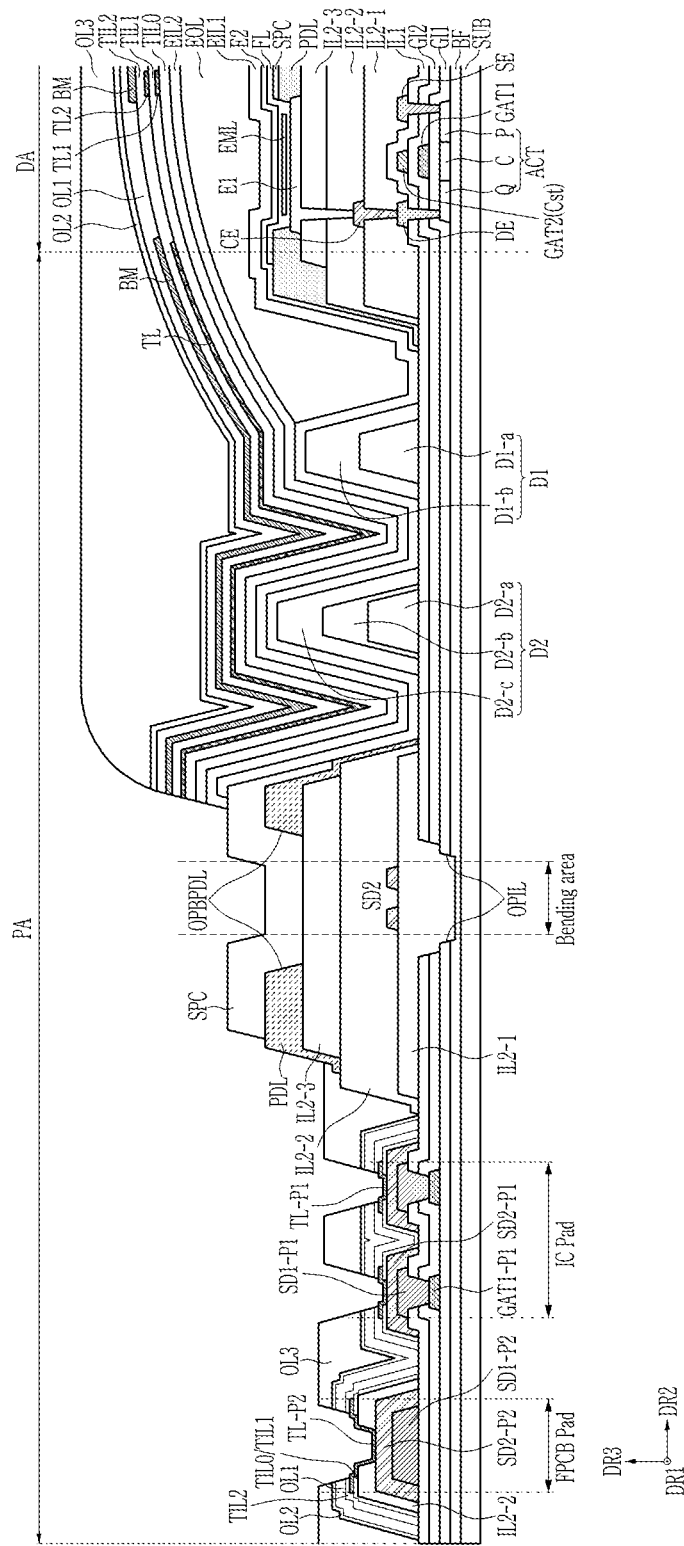
FIG. 16 is a schematic cross-sectional view taken along a peripheral area.

Description of a peripheral area of a display panel according to an embodiment is provided below with reference to FIG. 16. FIG. 16 is a schematic cross-sectional view taken along a peripheral area.

A description of and the same elements as the above-described elements will be omitted.

Referring to FIG. 16, a first insulation layer TIL0, a first touch insulation layer TIL1 a second touch insulation layer TIL2, a light blocking member BM, a reflection adjustment layer OL1, a second capping layer OL2, and an overcoat layer OL3 may extend from a display area DA, and may be positioned in a peripheral area PA. A signal line TL may extend from a second conductive layer TL2. The embodiment of FIG. 15 is different from the embodiment of FIG. 16 at least in that the reflection adjustment layer OL1 may extend to the peripheral area PA.

The second touch insulation layer TIL2, the reflection adjustment layer OL1, the second capping layer OL2, and the overcoat layer OL3 may be positioned between a bending area and a driver pad portion IC pad. The second touch insulation layer TIL2, the reflection adjustment layer OL1, the second capping layer OL2, and the overcoat layer OL3 may be positioned between the driver pad portion IC Pad and a circuit board pad portion FPCB Pad.

Figure 17:
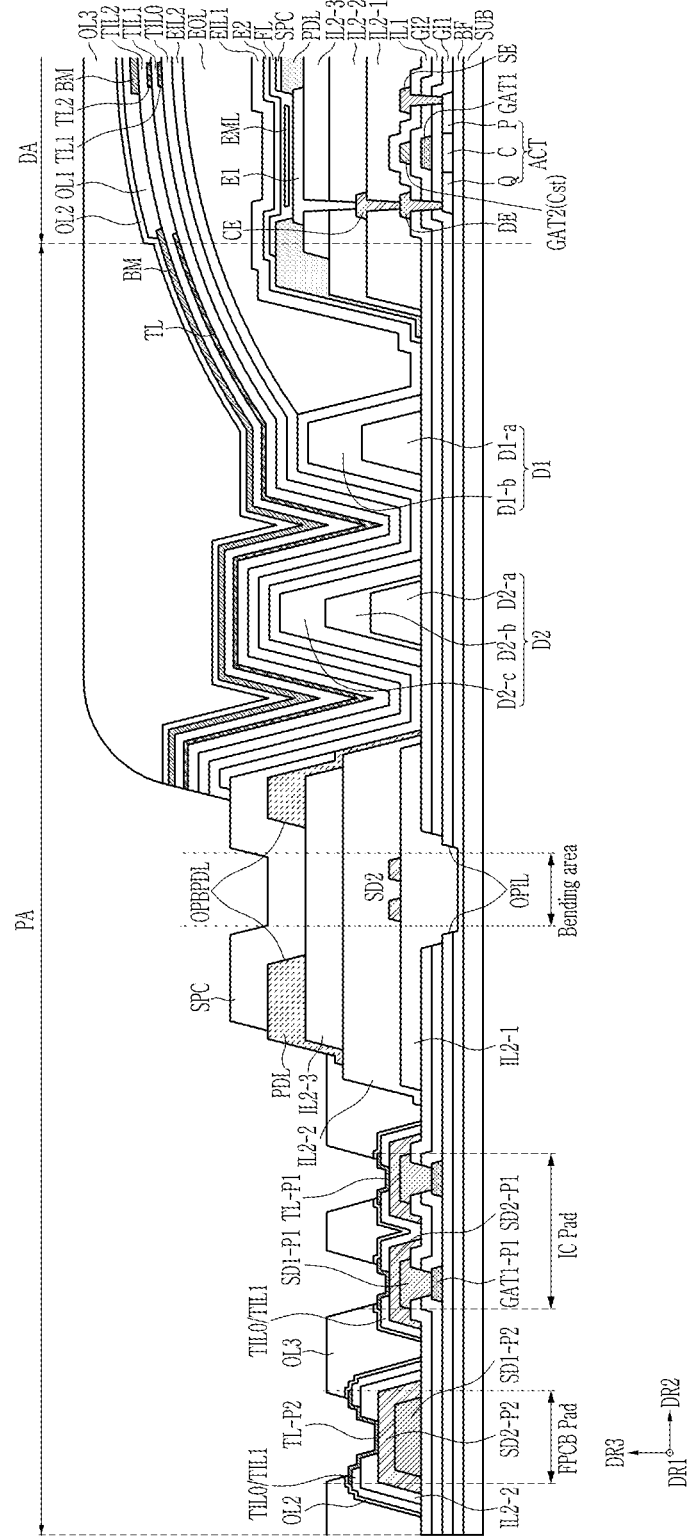
FIG. 17 is a schematic cross-sectional view taken along a peripheral area.

A peripheral area of a display panel according to an embodiment will be described with reference to FIG. 17. FIG. 17 is a schematic cross-sectional view taken along a peripheral area. A description of and the same elements as the above-described elements will be omitted.

Referring to FIG. 17, a first insulation layer TIL0, a first touch insulation layer TIL1 a light blocking member BM, a second capping layer OL2, and an overcoat layer OL3 may extend from a display area DA, and may be positioned in a peripheral area PA. The embodiment of FIG. 15 is different from the embodiment of FIG. 17 at least in that a second touch insulation layer ITL2 may be omitted.

The second capping layer OL2 and the overcoat layer OL3 may be positioned between a bending area and a driver pad portion IC pad. The second capping layer OL2 and the overcoat layer OL3 may be positioned between the driver pad portion IC Pad and a circuit board pad portion FPCB Pad.

Figure 18:
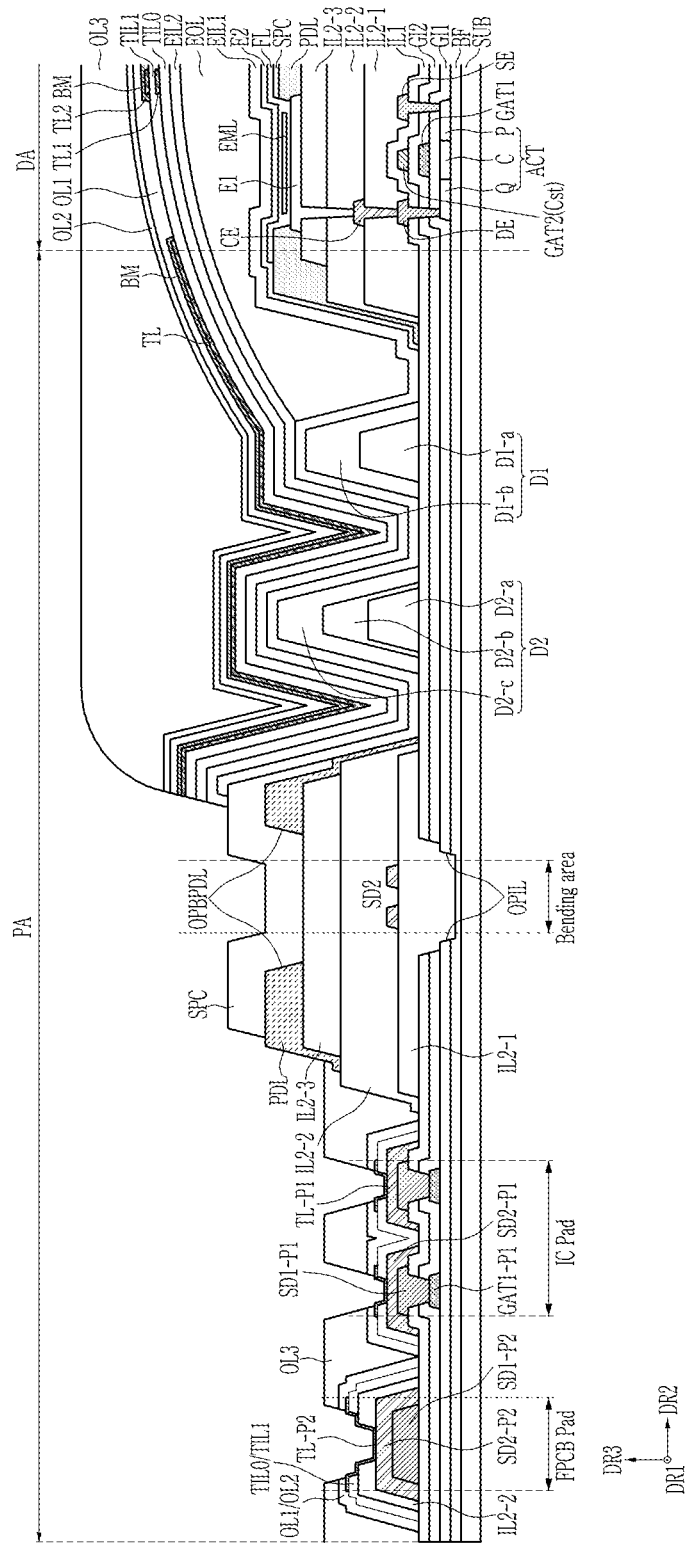
FIG. 18 is a schematic cross-sectional view taken along a peripheral area.

Description of a peripheral area of a display panel according to an embodiment is provided below with reference to FIG. 18. FIG. 18 is a schematic cross-sectional view taken along a peripheral area.

A description of and the same elements as the above-described elements will be omitted.

Referring to FIG. 18, a first insulation layer TIL0, a first touch insulation layer TIL1, a light blocking member BM, a reflection adjustment layer OL1, a second capping layer OL2, and an overcoat layer OL3 may extend from a display area DA, and may be positioned in a peripheral area PA. The embodiment of FIG. 16 is different from the embodiment of FIG. 18 at least in that a second touch insulation layer ITL2 is omitted.

The reflection adjustment layer OL1, the second capping layer OL2, and the overcoat layer OL3 may be positioned between a bending area and a driver pad portion IC pad. The reflection adjustment layer OL1, the second capping layer OL2, and the overcoat layer OL3 may be positioned between the driver pad portion IC Pad and a circuit board pad portion FPCB Pad.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a plurality of light emitting elements disposed on a substrate, and each of the plurality of light emitting elements including:
   a first electrode;
   an emission layer; and
   a second electrode;
   a low-reflective layer disposed on the light emitting element, and including an inorganic material;
   an encapsulation layer positioned on the low-reflective layer;
   a reflection adjustment layer positioned on the encapsulation layer;
   a capping layer positioned on the reflection adjustment layer; and
   an overcoat layer positioned on the capping layer, wherein
   the reflection adjustment layer includes dyes, pigments, or a combination thereof,
   the reflection adjustment layer comprises a first opening that overlaps a first component area and a second opening that overlaps a second component area, and
   the capping layer forms a step in the first opening and the second opening.

2. The display device of claim 1, wherein the capping layer includes an inorganic material.

3. The display device of claim 1, further comprising:
   a display area, the display area including:
   the first component area; and
   the second component area,
   wherein the first component area and the second component area are disposed in the display area; and
   a peripheral area that surrounds the display area.

4. The display device of claim 1, wherein
   the capping layer overlaps in a plan view the display area that includes the first component area and the second component area, and
   a thickness of the capping layer is uniform throughout the display area.

5. The display device of claim 1, wherein the overcoat layer fills the step.

6. The display device of claim 1, further comprising:
   a first conductive layer positioned on the encapsulation layer;
   a first touch insulation layer positioned on the first conductive layer;
   a second conductive layer positioned on the first touch insulation layer; and
   a light blocking member positioned on the second conductive layer.

7. The display device of claim 6, further comprising:
   a second touch insulation layer disposed between the light blocking member and the second conductive layer.

8. The display device of claim 6, wherein
   the second conductive layer contacts the light blocking member.

9. The display device of claim 1, further comprising:
   a partition wall overlapping the first electrode in a plan view and including a first opening that exposes at least a part of the first electrode.

10. The display device of claim 9, wherein the capping layer and the overcoat layer comprise a second opening overlapping the first opening in a plan view.

11. The display device of claim 9, wherein the capping layer and the overcoat layer overlap the first opening in a plan view.

12. A display device comprising:
    a display area;
    a peripheral area;
    a plurality of light emitting elements disposed on a substrate in the display area, and each of the plurality of light emitting elements including:
    a first electrode;
    an emission layer; and
    a second electrode;
    a low-reflective layer disposed on the light emitting element and including an inorganic material;
    an encapsulation layer positioned on the low-reflective layer;
    a reflection adjustment layer positioned on the encapsulation layer;
    a capping layer positioned on the reflection adjustment layer; and
    an overcoat layer positioned on the capping layer,
    wherein the capping layer and the overcoat layer overlap the peripheral area in a plan view, and
    the reflection adjustment layer includes dyes, pigments, or a combination thereof, wherein the reflection adjustment layer comprises a first opening that overlaps a first component area and a second opening that overlaps a second component area, and the capping layer forms a step in the first opening and the second opening.

13. The display device of claim 12, further comprising:

a first conductive layer positioned on the encapsulation layer;

a first touch insulation layer positioned on the first conductive layer;

a second conductive layer positioned on the first touch insulation layer; and a light blocking member positioned on the second conductive layer.

14. The display device of claim 13, wherein the peripheral area comprises a driver pad portion and an FPCB (flexible printed circuit board) pad portion.

15. The display device of claim 14, further comprising:

a second touch insulation layer disposed between the second conductive layer and the light blocking member, wherein the second touch insulation layer, the capping layer, and the overcoat layer are disposed between the driver pad portion and the FPCB pad portion.

16. The display device of claim 14, further comprising:

a second touch insulation layer disposed between the second conductive layer and the light blocking member, wherein the second touch insulation layer, the reflection adjustment layer, the capping layer, and the overcoat layer are disposed between the driver pad portion and the FPCB pad portion.

17. The display device of claim 14, wherein the capping layer and the overcoat layer are disposed between the driver pad portion and the FPCB pad portion.

18. The display device of claim 14, wherein the reflection adjustment layer, the capping layer, and the overcoat layer are disposed between the driver pad portion and the FPCB pad portion.

* * * * *